(12) United States Patent
Bhattacharyya

(10) Patent No.: US 7,750,395 B2
(45) Date of Patent: Jul. 6, 2010

(54) SCALABLE FLASH/NV STRUCTURES AND DEVICES WITH EXTENDED ENDURANCE

(75) Inventor: Arup Bhattacharyya, Essex Junction, VT (US)

(73) Assignee: Micron Technology, Inc., Boise, ID (US)

( * ) Notice: Subject to any disclaimer, the term of this patent is extended or adjusted under 35 U.S.C. 154(b) by 205 days.

(21) Appl. No.: 12/133,110

(22) Filed: Jun. 4, 2008

(65) Prior Publication Data

US 2008/0230827 A1    Sep. 25, 2008

Related U.S. Application Data

(62) Division of application No. 11/371,476, filed on Mar. 9, 2006, now Pat. No. 7,400,012, which is a division of application No. 09/944,985, filed on Aug. 30, 2001, now Pat. No. 7,012,297.

(51) Int. Cl.
*H01L 29/788* (2006.01)
(52) U.S. Cl. .............. 257/321; 257/E29.309; 257/324; 438/288
(58) Field of Classification Search ........... 257/315, 257/317, 319–321, 325, 324, E29.309, E29.129, 257/E29.165; 438/287, 288, 785
See application file for complete search history.

(56) References Cited

U.S. PATENT DOCUMENTS

| | | | |
|---|---|---|---|
| 3,978,577 A | 9/1976 | Bhattacharyya et al. | |
| 4,449,205 A | 5/1984 | Hoffman | |
| 4,495,219 A | 1/1985 | Kato et al. | |
| 4,717,943 A * | 1/1988 | Wolf et al. ............. | 257/324 |
| 4,757,360 A | 7/1988 | Faraone et al. | |
| 4,794,565 A | 12/1988 | Wu et al. | |
| 4,870,470 A | 9/1989 | Bass, Jr. et al. | |
| 4,939,559 A | 7/1990 | DiMaria et al. | |
| 5,332,915 A | 7/1994 | Shimoji et al. | |
| 5,399,516 A | 3/1995 | Bergendahl et al. | |
| 5,445,984 A | 8/1995 | Hong et al. | |
| 5,455,792 A | 10/1995 | Yi | |

(Continued)

OTHER PUBLICATIONS

Bhattacharyya, A., "Physical & Electrical Characteristics of LPCVD Silicon Rich Nitride", *ECS Technical Digest. J. Electrochem. Soc.*, 131(11), 691 RDP, New Orleans, (1984), 469C.

(Continued)

*Primary Examiner*—David Vu
(74) *Attorney, Agent, or Firm*—Schwegman, Lundberg & Woessner, P.A.

(57) ABSTRACT

Devices and methods are provided with respect to a gate stack for a nonvolatile structure. According to one aspect, a gate stack is provided. One embodiment of the gate stack includes a tunnel medium, a high K charge blocking and charge storing medium, and an injector medium. The high K charge blocking and charge storing medium is disposed on the tunnel medium. The injector medium is operably disposed with respect to the tunnel medium and the high K charge blocking and charge storing medium to provide charge transport by enhanced tunneling. According to one embodiment, the injector medium is disposed on the high K charge blocking and charge storing medium. According to one embodiment, the tunnel medium is disposed on the injector medium. Other aspects and embodiments are provided herein.

20 Claims, 22 Drawing Sheets

U.S. PATENT DOCUMENTS

| | | | |
|---|---|---|---|
| 5,498,558 | A | 3/1996 | Kapoor |
| 5,510,278 | A | 4/1996 | Nguyen et al. |
| 5,617,351 | A | 4/1997 | Bertin et al. |
| 5,646,430 | A | 7/1997 | Kaya et al. |
| 5,801,401 | A | 9/1998 | Forbes |
| 5,852,306 | A | 12/1998 | Forbes |
| 5,923,056 | A | 7/1999 | Lee et al. |
| 5,936,274 | A | 8/1999 | Forbes et al. |
| 5,952,692 | A | 9/1999 | Nakazato et al. |
| 5,991,225 | A | 11/1999 | Forbes et al. |
| 6,025,228 | A | 2/2000 | Ibok et al. |
| 6,025,627 | A | 2/2000 | Forbes et al. |
| 6,031,263 | A | 2/2000 | Forbes et al. |
| 6,069,380 | A | 5/2000 | Chou et al. |
| 6,101,131 | A | 8/2000 | Chang |
| 6,124,729 | A | 9/2000 | Noble et al. |
| 6,127,227 | A | 10/2000 | Lin et al. |
| 6,134,175 | A | 10/2000 | Forbes et al. |
| 6,141,238 | A | 10/2000 | Forbes et al. |
| 6,141,248 | A | 10/2000 | Forbes et al. |
| 6,143,636 | A | 11/2000 | Forbes et al. |
| 6,153,468 | A | 11/2000 | Forbes et al. |
| 6,163,049 | A | 12/2000 | Bui |
| 6,169,306 | B1 | 1/2001 | Gardner et al. |
| 6,172,397 | B1 | 1/2001 | Oonakado et al. |
| 6,208,164 | B1 | 3/2001 | Noble et al. |
| 6,210,999 | B1 | 4/2001 | Gardner et al. |
| 6,229,175 | B1 | 5/2001 | Uchida |
| 6,238,976 | B1 | 5/2001 | Noble et al. |
| 6,246,606 | B1 | 6/2001 | Forbes et al. |
| 6,249,020 | B1 | 6/2001 | Forbes et al. |
| 6,249,460 | B1 | 6/2001 | Forbes et al. |
| 6,288,419 | B1 | 9/2001 | Prall et al. |
| 6,307,775 | B1 | 10/2001 | Forbes et al. |
| 6,351,411 | B2 | 2/2002 | Forbes et al. |
| 6,424,001 | B1 | 7/2002 | Forbes et al. |
| 6,444,545 | B1 | 9/2002 | Sadd et al. |
| 6,461,931 | B1 | 10/2002 | Eldridge |
| 6,541,280 | B2 | 4/2003 | Kaushik et al. |
| 6,548,825 | B1 * | 4/2003 | Yoshii et al. .................. 257/24 |
| 6,586,797 | B2 | 7/2003 | Forbes et al. |
| 6,740,928 | B2 | 5/2004 | Yoshii et al. |
| 6,743,681 | B2 | 6/2004 | Bhattacharyya |
| 6,778,441 | B2 | 8/2004 | Forbes et al. |
| 6,784,480 | B2 | 8/2004 | Bhattacharyya et al. |
| 6,950,340 | B2 | 9/2005 | Bhattacharyya |
| 7,012,297 | B2 | 3/2006 | Bhattacharyya |
| 7,072,223 | B2 | 7/2006 | Bhattacharyya |
| 7,250,338 | B2 | 7/2007 | Bhattacharyya |
| 2001/0013621 | A1 | 8/2001 | Nakazato |
| 2002/0106536 | A1 | 8/2002 | Lee et al. |
| 2003/0042527 | A1 | 3/2003 | Forbes et al. |
| 2003/0042532 | A1 | 3/2003 | Forbes |
| 2003/0042534 | A1 | 3/2003 | Bhattacharyya |
| 2003/0043622 | A1 | 3/2003 | Forbes |
| 2003/0043630 | A1 | 3/2003 | Forbes et al. |
| 2003/0043632 | A1 | 3/2003 | Forbes |
| 2003/0043633 | A1 | 3/2003 | Forbes et al. |
| 2003/0043637 | A1 | 3/2003 | Forbes et al. |
| 2003/0045082 | A1 | 3/2003 | Eldridge et al. |
| 2003/0048666 | A1 | 3/2003 | Eldridge et al. |
| 2004/0004245 | A1 | 1/2004 | Forbes et al. |
| 2004/0004247 | A1 | 1/2004 | Forbes et al. |
| 2004/0004859 | A1 | 1/2004 | Forbes et al. |
| 2005/0012141 | A1 | 1/2005 | Bhattacharyya |
| 2005/0249024 | A1 | 11/2005 | Bhattacharyya |
| 2006/0001083 | A1 | 1/2006 | Bhattacharyya |
| 2006/0170032 | A1 | 8/2006 | Bhattacharyya |
| 2007/0047319 | A1 | 3/2007 | Bhattacharyya |

OTHER PUBLICATIONS

De Blauwe, J., et al., "A novel, aerosol-nanocrystal floating-gate device for non-volatile memory applications", *IEDM Technical Digest. International Electron Devices Meeting*, (Dec. 10-13, 2000), 683.686.

Han, Kwangseok, "Characteristics of P-Channel Si Nano-Crystal Memory", *IEDM Technical Digest, International Electron Devices Meeting*, (Dec. 10-13, 2000), 309-312.

Inumiya, S, et al., "Conformable formation of high quality ultra-thin amorphous $Ta_2O_5$ gate dielectrics utilizing water assisted deposition (WAD) for sub 50 nm damascene metal gate MOSFETs", *IEDM Technical Digest. International Electron Devices Meeting*, (Dec. 10-13, 2000), 649-652.

Lee, J., et al., "Effect of polysilicon gate on the flatband voltage shift and mobility degradation for ALD-Al/sub 2/O/sub 3/ gate dielectric", *International Electron Devices Meeting 2000. Technical Digest, IEDM*, (2000), 645-648.

Luan, H., "High Quality $Ta_2O_5$ Gate Dielectrics with Tox,eq less than 10A", *IEDM*, (1999), pp. 141-144.

Manchanda, L., "High K Dielectrics for CMOS and Flash", *Extended Abstracts of the 1999 International Conference on Solid State Devices and Materials*, Tokyo, (1999), 150-151.

Manchanda, L., et al., "High-K Dielectrics for Giga-Scale CMOS and Non-Volatile Memory Technology", *Lucent Technologies*, Bell Laboratories, (2000), 1 page.

Manchanda, L., "Si-doped aluminates for high temperature metal-gate CMOS: Zr-Al-Si-O, a novel gate dielectric for low power applications", *IEDM Technical Digest. Intenational Electron Devices Meeting*, (Dec. 10-13, 2000), 23-26.

Ohba, R., et al., "Non-volatile Si quantum memory with self-aligned doubly-stacked dots", *IEDM Technical Digest. International Electron Devices Meeting*, (Dec. 10-13, 2000), 313-316.

Yamaguchi, Takeshi, "Band Diagram and Carrier Conduction Mechanism in $ZrO_2$/Zr-silicate/Si MIS Structure Fabricated by Pulsed-laser-ablation Deposition", *Electron Devices Meeting, 2000. IEDM Technical Digest. International*, (2000), 19-22.

\* cited by examiner

SCALABLE FLASH/NV STRUCTURES AND DEVICES WITH EXTENDED ENDURANCE

CROSS-REFERENCE TO RELATED APPLICATIONS

The present application is a divisional of U.S. Ser. No. 11/371,476, filed on Mar. 9, 2006, now U.S. Pat. No. 7,400,012 which is a divisional of U.S. Ser. No. 09/944,985, filed on Aug. 30, 2001, now U.S. Pat. No. 7,012,297, both of which are incorporated herein by reference in their entirety.

TECHNICAL FIELD

This invention relates generally to integrated circuits and, more particularly, to nonvolatile programmable memory cells and reprogrammable logic circuit elements.

BACKGROUND

General CMOS silicon gate technology has been scaled rapidly from the 1.0 μm generation ($V_{DD}$=5.0 V) to the 0.13 μm generation ($V_{DD}$=1.5 V) over a period of little over a decade. However, the progress of scaling Flash/NV programming voltage and power has been limited. Additionally, the Flash/NV devices have a limited endurance. That is, these devices are capable of performing a limited number of write/erase cycles that prevent their use in a number of applications. The progress of extending the endurance of Flash/NV devices also has been limited.

Most NV devices have a floating gate and use a power hungry channel hot electron write process and a tunnel erase process through the tunnel oxide. The tunnel erase process requires both a high programming voltage and a programming field that approaches the breakdown of the oxide. Thus, conventional Flash/NV devices require attributes of high voltage technology and circuitry in an environment of scaled low voltage CMOS technology. As such, the integration of NV devices with general high performance logic technology and DRAM technology is complicated. Additionally, the endurance of these NV devices is limited to about 10E5-10E6 cycles. Therefore, providing embedded Flash/EPROM in a general random logic or DRAM environment to achieve enriched functions requires complex circuitry and many additional masks, resulting in a relatively limited yield and high cost.

Two phase insulating materials, referred to as silicon-rich insulators (SRI), are known. SRI includes controlled and fine dispersions of crystalline silicon in a background of stoichiometric insulator such as $SiO_2$ (referred to as silicon-rich oxide or SRO), or $Si_3N_4$ (referred to as silicon-rich nitride or SRN). A unique set of insulators with a controlled and wide range of electrical properties can be formed by controlling the amount, distribution and size of silicon crystals.

SRI materials are capable of possessing charge trapping and charge injecting properties. "Charge-centered" SRI has refractive index in a range that provides the material with the property for trapping electrons or holes at the silicon centers due to the creation of quantum potential wells. "Injector" SRI has a refractive index in a range that provides the material with silicon centers that are within tunneling distance of each other such that charge can readily communicate between the charge centers. Injector SRI is characterized by high conductivity and behaves like semi-metal. The apparent high frequency dielectric constant of this material is greater than that of silicon. When superimposed on top of a dielectric, charge injected into this material from a metal plate is uniformly distributed to the silicon centers, which in turn injects charges uniformly into the insulator when biased. Thus, the injector SRI reduces local field fluctuations due to defects. At the same time, a large number of silicon injector centers at the insulator interface provides a geometrical pattern that enhances the tunneling, and thus the charge transfer or conduction, at significantly reduced average fields. This material has been termed an "injector" because of this enhanced tunneling.

Charge-centered or trapping SRI is a charge storing medium that includes charge-centered SRO characterized by a refractive index in the approximate range of 1.5 to 1.6, and further includes charge-centered SRN characterized by a refractive index in the approximate range from 2.1 to 2.2. Injector SRI is a charge injector medium that includes injector SRO characterized by a refractive index that is approximately 1.85 and greater, and further includes injector SRN characterized by a refractive index that is approximately 2.5 and greater. It was observed that the SRN class of materials was significantly more stable at high temperature compared to SRO in terms of interdiffusion and growth of silicon centers during high temperature processing as well as in terms of providing a reproducible interface between silicon and SRI and/or $SiO_2$ and SRI.

It has been proposed to use charge centered and injector SRI material in a variety of NV FET structures and associated Flash, PROM, EPROM, EEPROM, antifuse cells and arrays. In one of these proposed embodiments, the gate insulator stack includes a tunnel oxide, a thin layer of charge-centered SRN to trap charges and thereby act like a "floating plate," an overlayer of thicker CVD oxide, and a layer of injector SRN. The top CVD oxide is designed to prevent charge loss at the operating field and to be optimized for the appropriate programming voltage. The equivalent oxide thickness ($t_{OX}$) of the gate insulator stack is primarily dependent on the tunnel oxide and the barrier CVD oxide thickness. The stack is scalable with respect to the programming voltage because the required programming field is reduced to 6-7E6 V/cm due to the injector-induced enhanced tunneling compared to 10-11 E6 V/cm for a conventional NV/FET structure. Additionally, the programming gate voltage is directly coupled into the charge-centered layer to provide 100% coupling efficiency compared to the typical floating gate structures where capacitor divider effects and the cell geometry determine the coupling efficiency. The coupling efficiency for a floating gate structure is typically around 50%-70%. These proposed devices were shown to exhibit many orders of magnitude greater retention because of the reduced programming field. These devices are significantly more power efficient as they are written to and erased by direct tunneling, rather than by channel hot electron injection. However, the write/erase fields were still too high, and both the endurance and power reductions were still too limited.

Silicon "quantum dots" of 3 nm to 10 nm diameter have been fabricated in a controlled manner by either Low Pressure Chemical Vapor Deposition (LPCVD) followed by oxidation or by gas phase pyrolysis of silane to create nano crystal silicon aerosol. It has been proposed to either place these silicon nano crystals on top of the tunnel oxide or embed them into the gate insulator oxide. These nano crystals behave as charge centers similar to the charge-centered SRI layer described above. NV FET gate stacks were formed with the silicon quantum dots by adding a thicker oxide overlayer. While somewhat reduced voltage write/erase and up to 10E6 endurance were demonstrated, the write/erase fields were still too high, and both the endurance and the power reductions were still too limited.

Therefore, there is a need in the art to provide Flash/NV technology that overcomes these problems by being capable of using scalable programmable voltages and power, by being easily integratable with general scaled logic technology while minimizing the overhead associated with Flash/NV technology features, by extending endurance, and by providing faster write-erase cycles without impacting retention and reliability.

DETAILED DESCRIPTION

Figure 1:
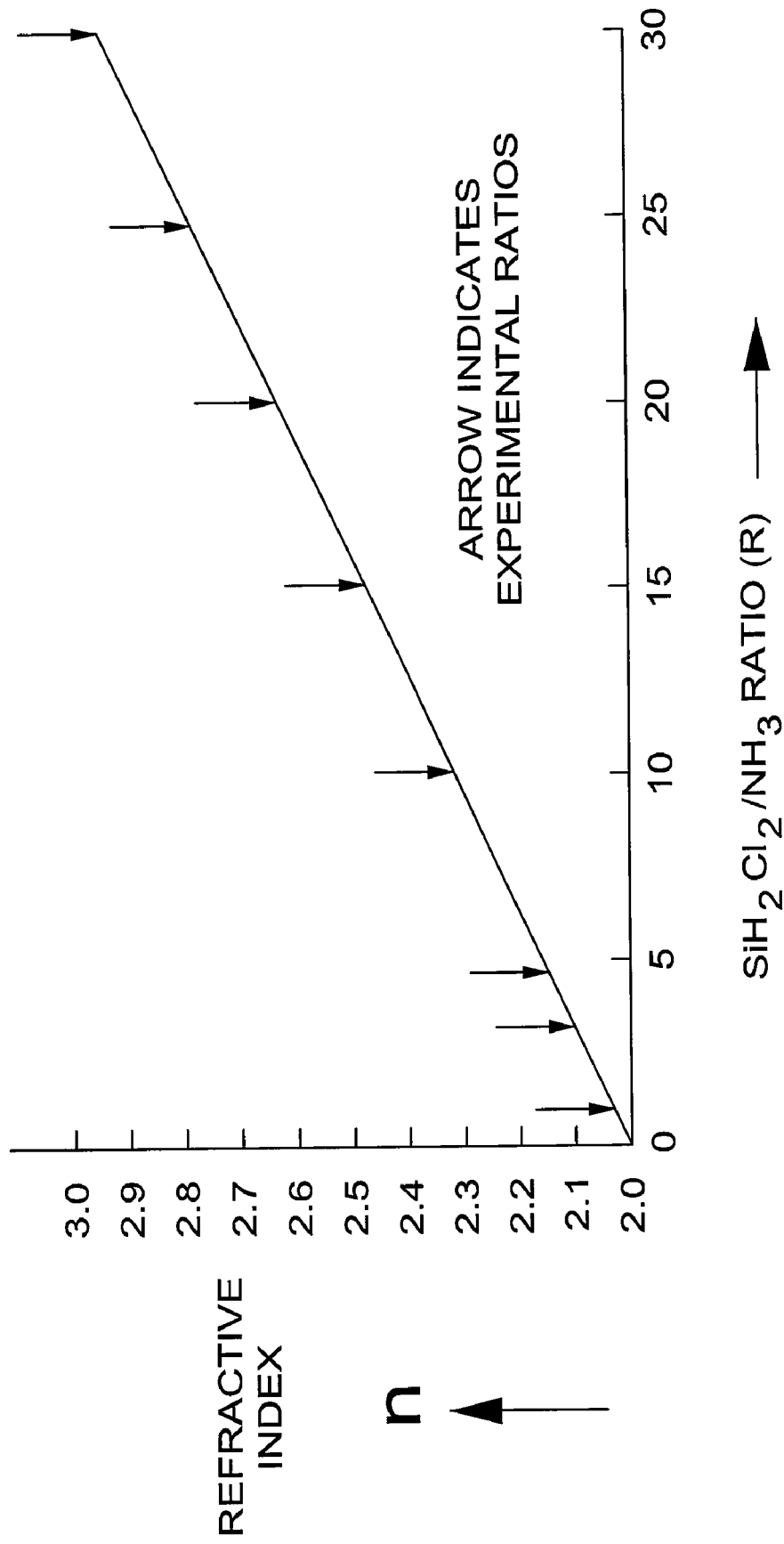
FIG. 1 is a graph showing refractive index of silicon-rich silicon nitride films versus $SiH_2Cl_2/NH_3$ flow rate ratio.

The following detailed description refers to the accompanying drawings which show, by way of illustration, specific aspects and embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims, along with the full scope of equivalents to which such claims are entitled.

The present subject matter provides a scalable Flash/NV structure that further extends the scalability of NV technology by providing a gate stack with a high K dielectric, a charge center or charge storing medium and a least one charge injector medium. In various embodiments, the insulator stack consists of either a 4-layer element or a 5-layer element. The 4-layer element provides a tunneling medium, a charge storing medium, a charge blocking medium and a charge injector medium. The 5-layer element stack creates yet lower field programming by adding a second injector medium. According to one embodiment, the charge store layer and the charge blocking layer are co-produced as one layer, as in the case of SRI, so as to reduce the 4-layer element to a 3-layer element and to reduce the 5-layer element to a 4-layer element. The gate stack is programmable with boot-strapped circuits without a charge pump or high voltage add-on technology. According to various embodiments, the gate stack has an equivalent oxide thickness ($t_{ox}$) in the range of 5 nm-15 nm, and a programming voltage across the stack (depending on the stack thickness) as low as 4-5 V, with a programming window of −2 V.

In addition to the power savings attributable to the reduced programming power, which is about one fourth of that for a conventional NV device, the structure of the present invention is currently believed to have greater than four orders of magnitude better endurance than possible up until this time. Additionally, the structure of the present invention has variables that are capable of being manipulated to scale the programmable voltages and power. Furthermore, since the programming voltage is significantly less than the breakdown voltage of the dielectric, these variables are capable of being manipulated to achieve faster write-erase cycles. It is believed that the write-erase cycle speed can be enhanced by greater than three orders of magnitude.

FIG. 1 is a graph showing refractive index of silicon-rich silicon nitride films versus $SiH_2Cl_2/NH_3$ flow rate ratio (R). This graph is provided herein to illustrate the known relationship between the silicon amount and the refractive index. The graph indicates that the index of refraction increases linearly with increasing silicon content. As such, the index of refraction of the films can be used as an indication of the silicon content of the films.

Figure 2:
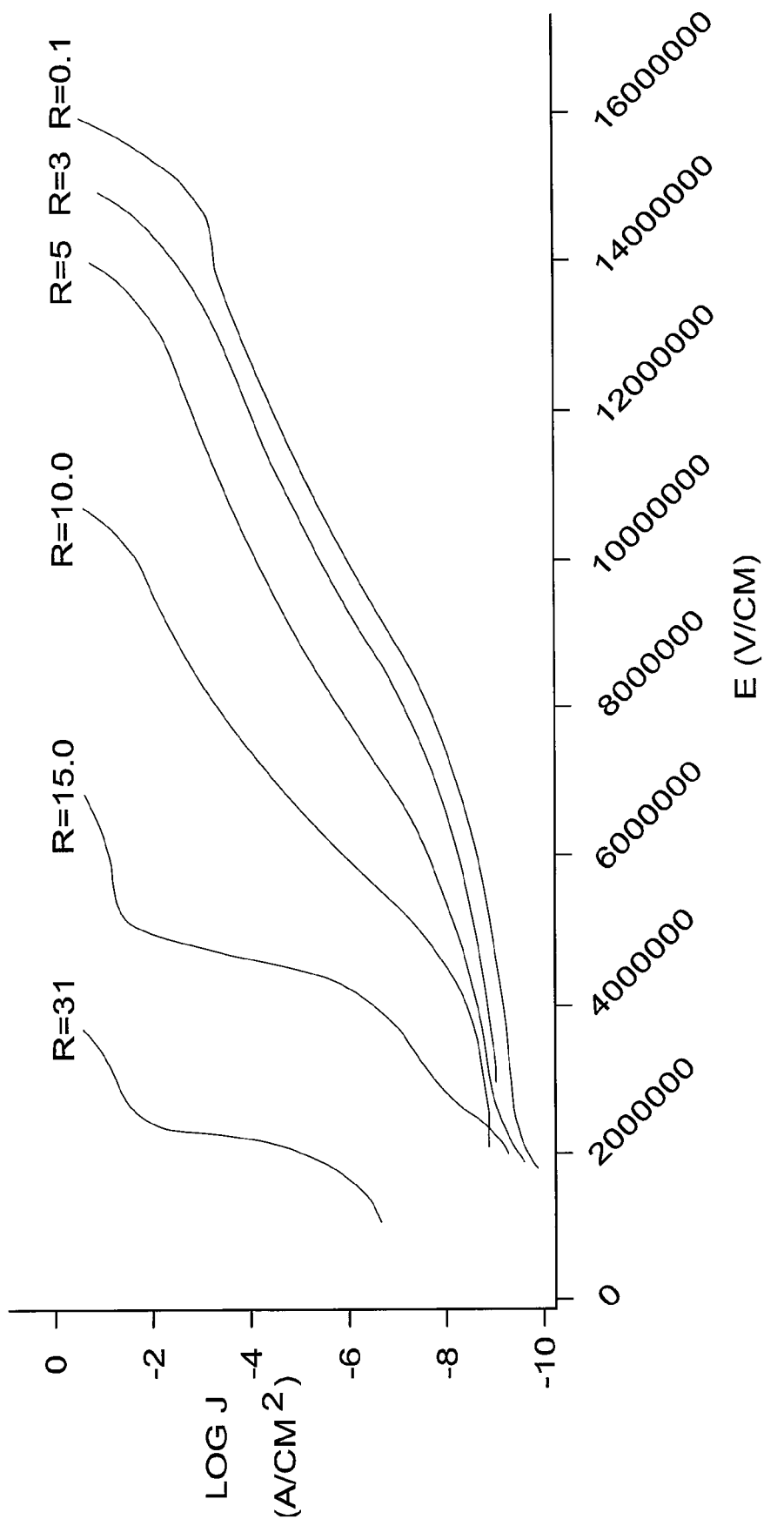
FIG. 2 is a graph showing current density versus applied field for silicon-rich silicon nitride films having different percentages of excess silicon.

FIG. 2 is a graph showing current density versus applied field for silicon-rich silicon nitride films having different percentages of excess silicon. The current density (J) is represented in amperes/cm$^2$, and log J is plotted against the electric field E (volts/cm) for $Si_3N_4$ layers having a $SiH_2Cl_2/NH_3$ flow rate ratio R of 0.1, 3, 5, 10, 15 and 31. This graph is provided herein to illustrate the known relationship between the amount of silicon and the conductivity of the film. The plot shows that the $Si_3N_4$ layers having small additions of silicon (R=3 and 5) exhibit a relatively small conductivity increase over stoichiometric $Si_3N_4$. The plot further shows that increasing silicon content at or above R=10 substantially increases or enhances the conductivity.

Figure 3:
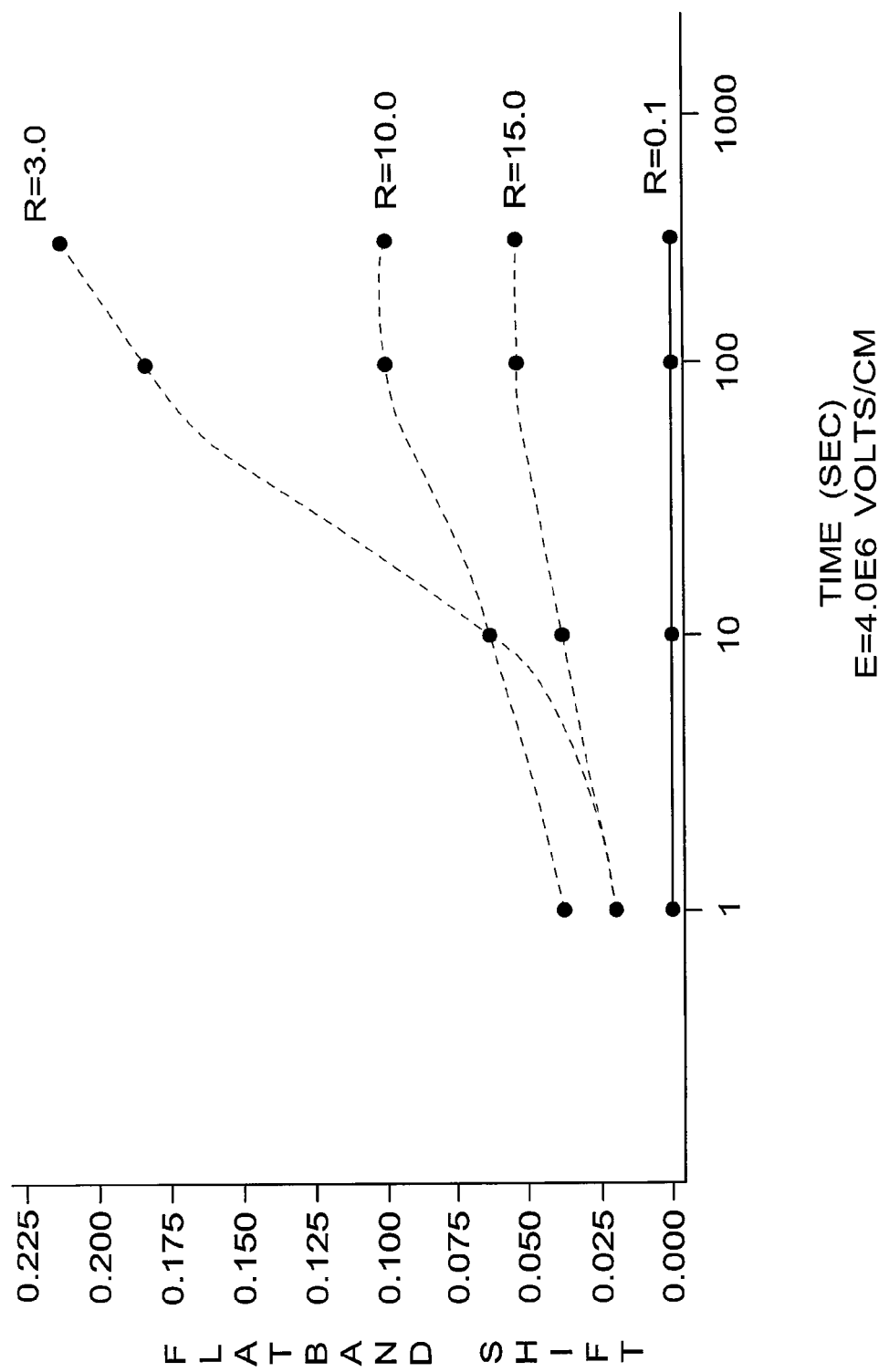
FIG. 3 is a graph showing flat band shift versus time at an applied field of $4\times10^6$ volts/cm for silicon-rich silicon nitride films having varying percentages of excess silicon.
Figure 4:
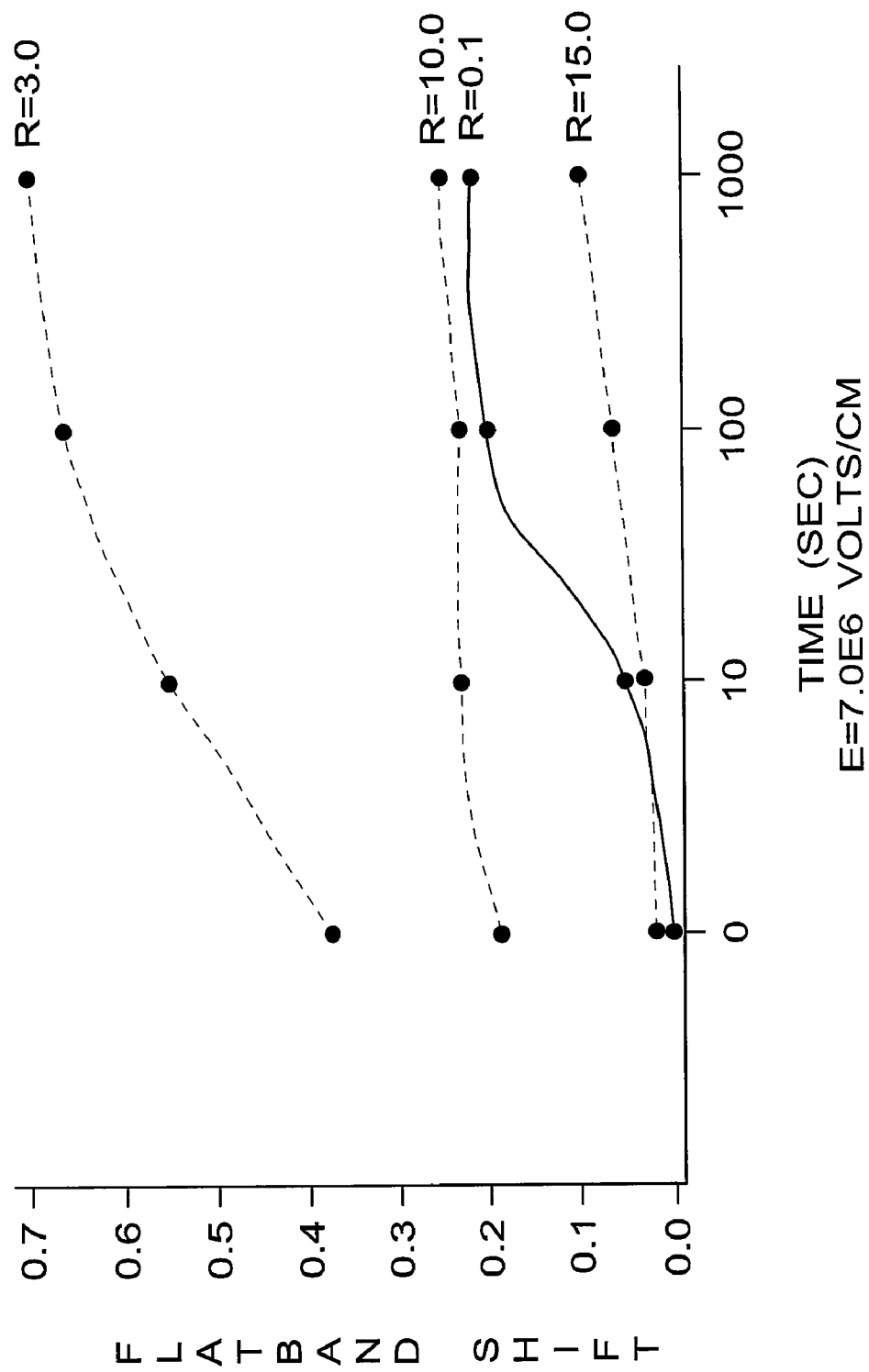
FIG. 4 is a graph showing flat band shift versus time at an applied field of $7\times10^6$ volts/cm for silicon-rich silicon nitride films having varying percentages of excess silicon.

FIGS. 3 and 4 provide graphs that illustrate the known relationship between the flatband shift and applied fields for films having varying percentages of excess silicon as represented by the $SiH_2Cl_2/NH_3$ flow rate ratio R. FIG. 3 is a graph showing flatband shift versus time at an applied field of $4\times10^6$ volts/cm for silicon-rich silicon nitride films having varying percentages of excess silicon. For R=3, the flatband shift is greater than the shifts produced by films having an R of 0.1, 10 or 15. The film having an R of 10 provides a greater flatband shift than a film having an R of 15. FIG. 4 is a graph showing flatband shift versus time at an applied field of $7\times10^6$ volts/cm for silicon-rich silicon nitride films having varying percentages of excess silicon. The flatband shift produced by the R=3 film is even greater than that shown in FIG. 3, while the shifts produced by the R=10 and R=15 films do not change as appreciably. FIGS. 3 and 4 are provided to illustrate the characteristics of a charge storing medium and a more conductive charge injector medium as further explained below.

The graphs of FIGS. 1-4, which were described above, indicate that at low additional silicon content, silicon-rich $Si_3N_4$ films function as a charge storing medium as they exhibit appreciably enhanced trapping characteristics (as shown by the high flatband shifts at moderate and high applied electric fields in FIGS. 3 and 4, respectively) without exhibiting appreciably enhanced conductivity characteristics as shown in FIG. 1.

Silicon-rich silicon nitride films deposited at an R of 3 or 5 (for a refractive index of 2.10 and 2.17, respectively) will possess a charge storing function or property normally provided by a polysilicon floating gate of a EEPROM cell. In general, silicon-rich nitride films having an R greater than 0.1 and less than 10 (or, more specifically, having an index of refraction between approximately 2.10 and 2.30) will provide appreciably enhanced charge trapping or charge storing properties without providing appreciably enhanced charge conduction. This charge trapping is characteristic of a charge storing medium that can be used as a floating plate within a gate stack of a NV device.

Silicon-rich nitride films having an R greater than 10 (or, more specifically, having an index of refraction greater than 2.3) are referred to as an injector medium. Silicon nitride injectors are preferred over silicon oxide injectors because the two-phase nature of the interface is believed to provide a localized electric field distortion and an associated enhanced charge transport (high conduction). Silicon readily diffuses within silicon oxide at elevated processing temperatures, which disrupts the injection threshold by reducing the localized field distortions. However, even at higher processing temperature, silicon does not readily diffuse with $Si_3N_4$. A silicon-rich $Si_3N_4$ (SRN) injector provides appreciably enhanced charge conductance without providing appreciably enhanced charge trapping over stoichiometric $Si_3N_4$. This is illustrated in FIGS. 3 and 4, which shows progressively reduced flatband shifts for R=10 and R=15 with progressively increased conduction.

Figure 5:
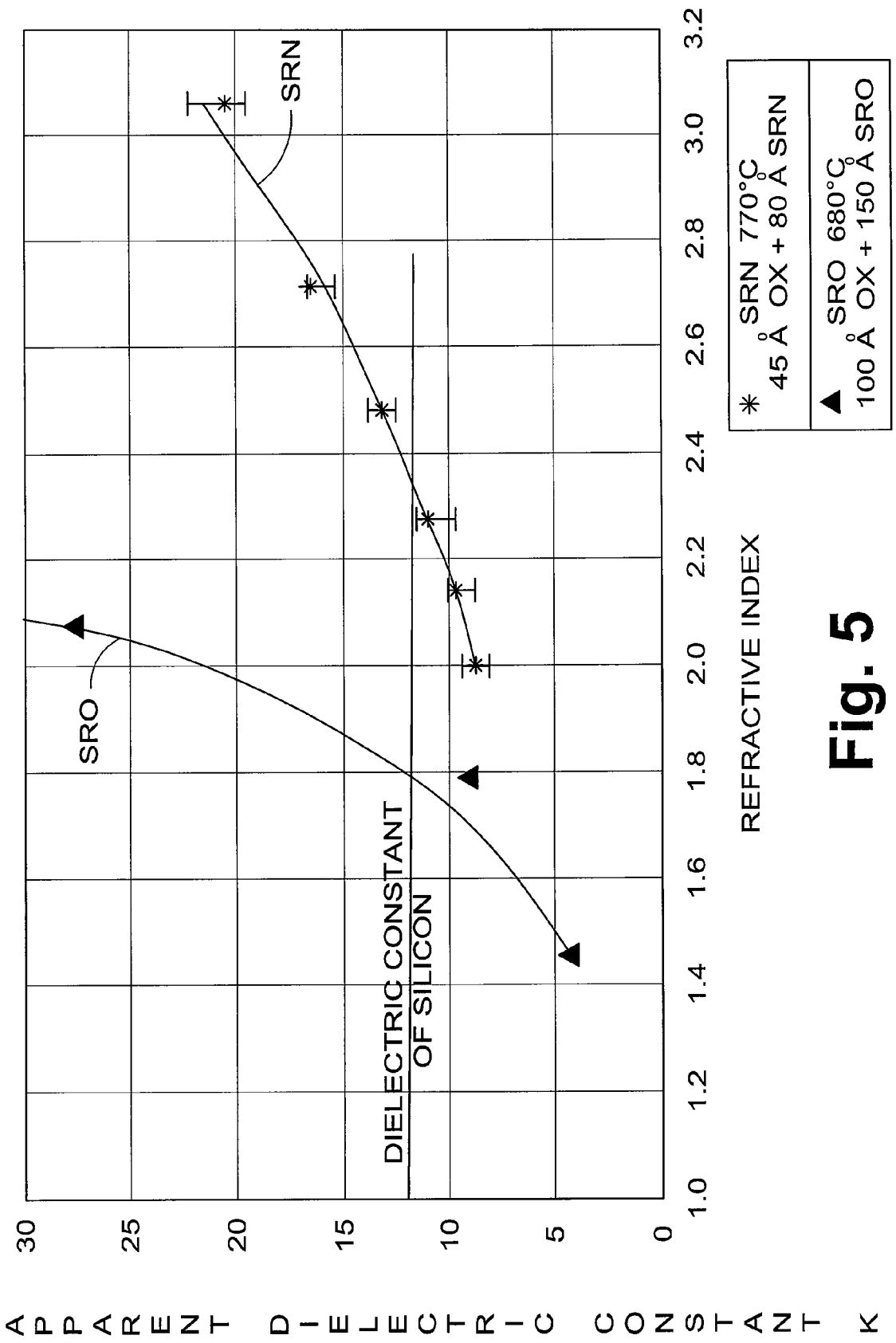
FIG. 5 is a graph showing apparent dielectric constant K versus refractive index for both Silicon Rich Nitride (SRN) and Silicon Rich Oxide (SRO).

FIG. 5 is a graph showing apparent dielectric constant K versus refractive index for both Silicon Rich Nitride (SRN) and Silicon Rich Oxide (SRO). The SRN and SRO plotted in this graph were provided using a Low Pressure Chemical Vapor Deposition (LPCVD) process. The SRO was fabricated at approximately 680E C, and the fabricated structure included 100 Δ oxide and 150 Δ SRO. The SRN was fabricated at approximately 770E C, and the fabricated structure included 45 Δ oxide and 80 Δ SRN. As shown in the graph, the dielectric constant of silicon is around 12. Materials with a higher K than silicon are conventionally termed a high K material, and materials with a lower K than silicon are conventionally termed a low K material. SRN that has a refractive index of 2.5 or greater and SRO that has a refractive index of 1.85 or greater have apparent dielectric constants that are greater than 12. Injector SRI includes these high K SRO and high K SRN. Charge-centered SRI includes low K SRO and low K SRN.

Figure 6:
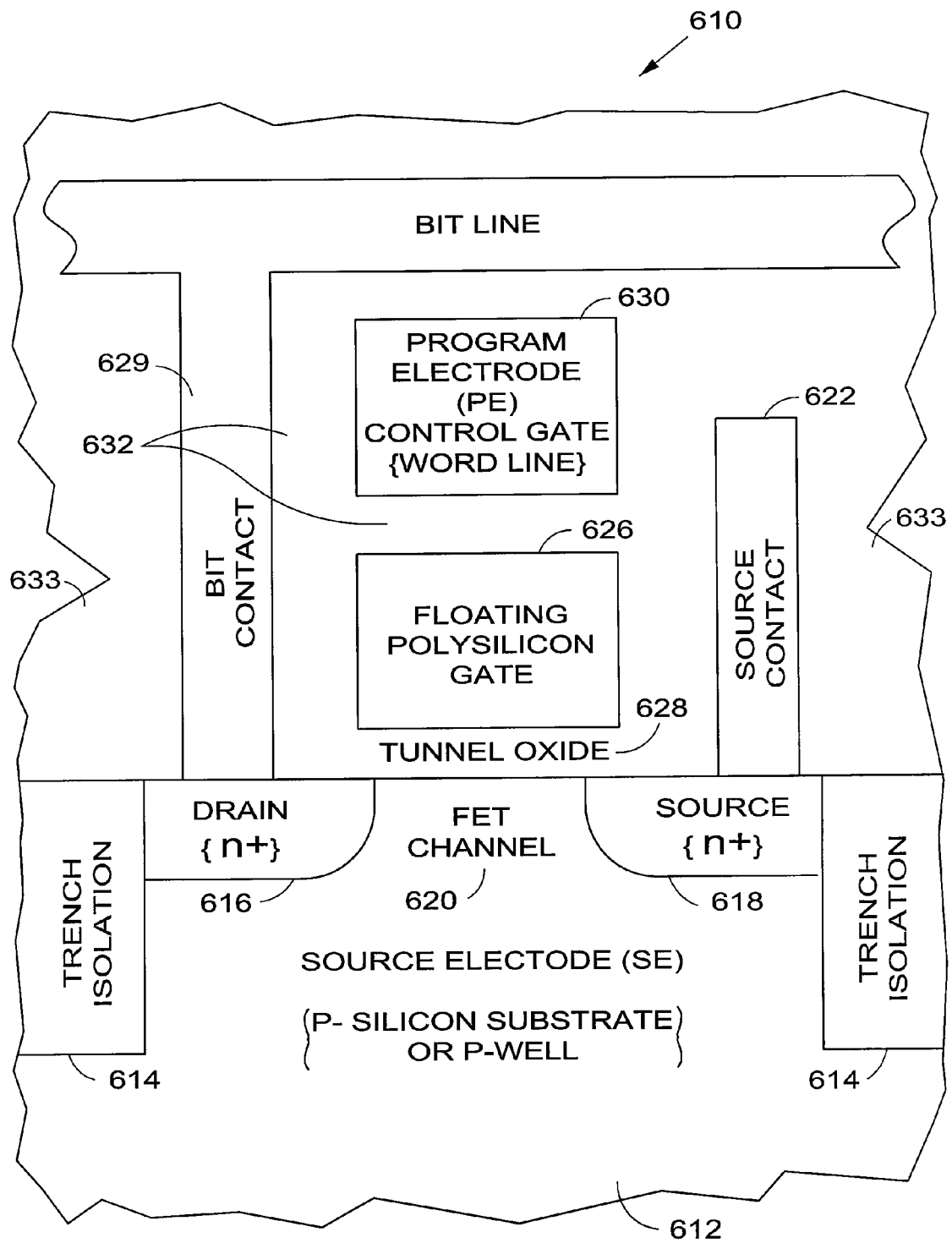
FIG. 6 is a cross-section view of a conventional nonvolatile field effect transistor (NV FET) device or Flash device.

FIG. 6 is a cross-section view of a conventional nonvolatile field effect transistor (NV FET) device such as a Flash device. The illustrated device is fabricated on a silicon substrate 612 such as a p silicon substrate or p-well in which case it is referred to as a source electrode (SE), and is separated from other devices by the isolation trenches 614. The device 610 further includes diffused regions that function as a drain region 616 and a source region 618, such as the illustrated n+ diffused regions in the p substrate. A field effect transistor (FET) channel 620 is formed in the substrate between the drain and source regions. A source contact 622 is formed to electrically couple with the source region 618, and a bit contact 624 is formed to electrically couple with the drain region 616. A floating polysilicon gate 626 is formed over the FET channel 620, and is separated from the FET channel 620 by tunnel oxide 628. A control gate 630, referred to as a program electrode (PE) for the illustrated embodiment, is formed over the floating polysilicon gate 626. An oxide/nitride/oxide (ONO) interpoly dielectric 632 is provided around and between the PE 630 and the floating gate 626. A bit line is connected to the bit contact, and a word line is connected the PE. An oxide 633 is formed around the NV FET device.

Common dimensions for a typical NV FET device in the 0.13 to 0.15 μm technology generations are provided below. The cell size for a NAND gate is approximately 0.15 μm$^2$. The FET channel is approximately 150 nm wide. Both the floating gate and the PE are approximately 150 nm wide and about 250 nm thick. The tunnel oxide separating the floating gate from the FET channel is approximately 8 nm thick. The ONO interpoly dielectric separating the PE and the floating gate is approximately 15 nm thick. The programming voltage applied to the PE is about 16 volts, and the pulse width of a programming pulse is approximately 1 ms. The field generated across the tunnel oxide is approximately $12\times10^6$ V/cm. The minimum program window ($V_T$("1")–$V_T$("0")) is approximately 2 V. The minimum program window is defined as the difference in the threshold voltages for a device with a stored one and a device with a stored zero. The endurance for a typical NV FET device is about $10^5$ write/erase cycles. The power supply $V_{DD}$ is 3.3 V.

Figure 7:
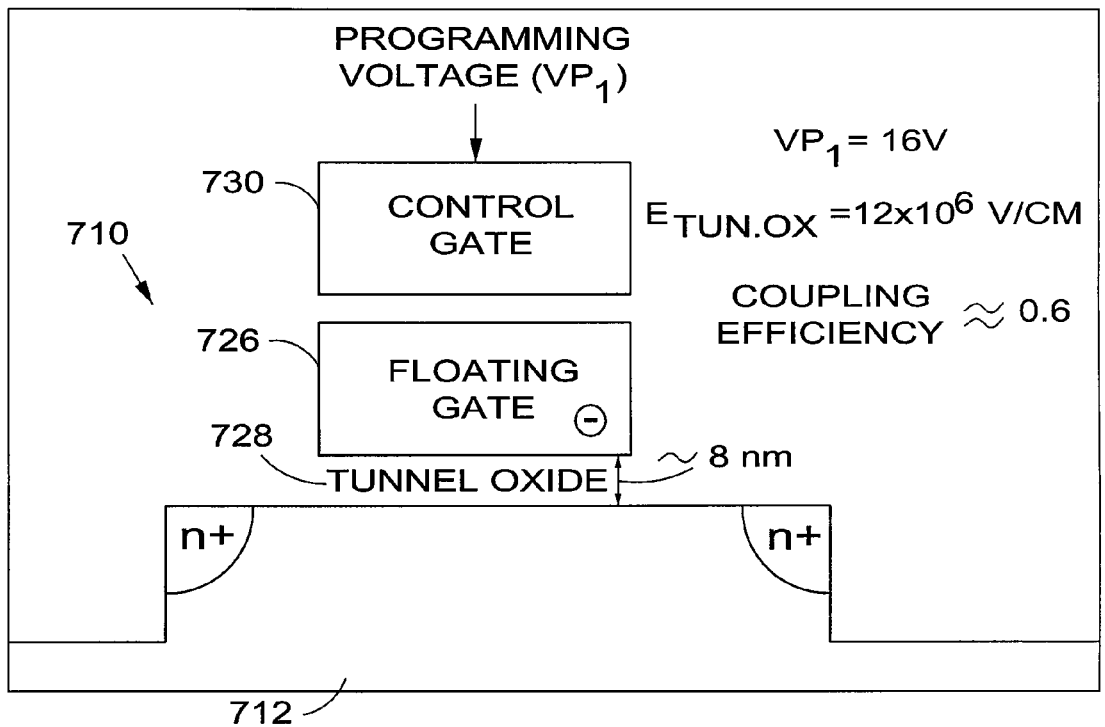
FIG. 7 illustrates the capacitive coupling for a conventional Flash device.

FIG. 7 illustrates the capacitive coupling for a conventional Flash device. Again, the device 710 includes a control gate or PE 730, a floating gate 726, and a substrate or SE 712. A programming voltage $VP_1$ of 16 V is applied to the control gate. The electric field across about 8 nm of tunnel oxide 728 ($E_{TUN.OX}$) is approximately $12 \times 10^6$ V/cm, which reflects a coupling efficiency of about 60%. The low efficiency is attributable to the geometry and capacitor divider effects of the cell.

Figure 8:
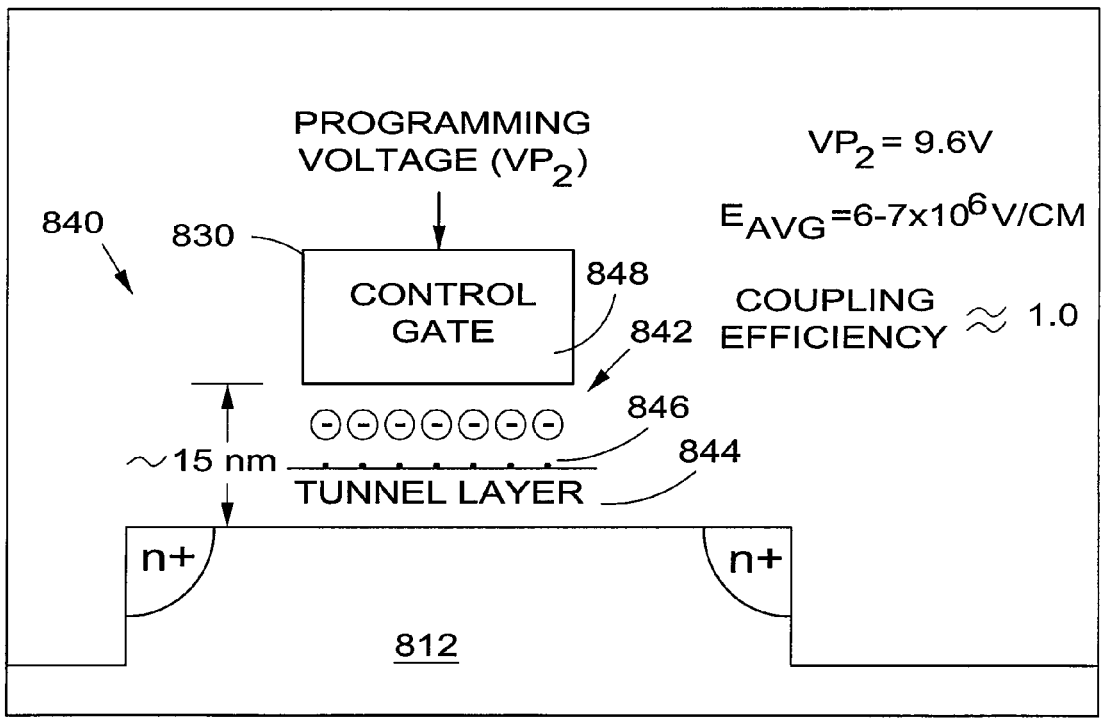
FIG. 8 illustrates the capacitive coupling for a nonvolatile floating plate device.

FIG. 8 illustrates the capacitive coupling for a nonvolatile floating plate device. The device 840 includes a control gate 830 separated from a substrate by a gate stack 842. The gate stack 842 includes a tunnel insulator 844, charge centers 846 that form a floating plate capable of storing charge, and a charge blocking dielectric 848. A programming voltage $VP_2$ of 9.2 V is applied to the control gate 830. As there is no separate floating gate, the coupling efficiency is 100%. The average electric field $E_{AVG}$ between the charge centers 846 and the substrate 812 is between about 6 to $7 \times 10^6$ V/cm.

Figure 9:
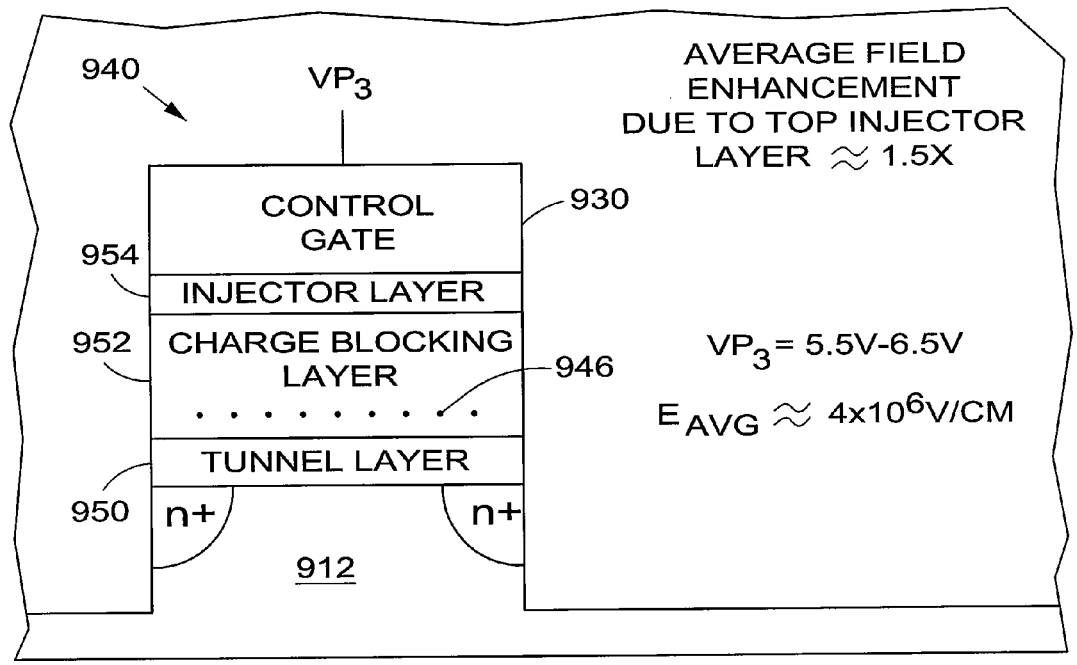
FIG. 9 illustrates the average field enhancement due to the incorporation of a top injection layer in a gate stack for a nonvolatile floating plate device.

FIG. 9 illustrates the average field enhancement due to the incorporation of a top injection layer in a gate stack for a nonvolatile floating plate device. In this illustration, the gate stack 940, which is interposed between the control gate 930 and the substrate 912, includes a tunnel layer 950, a charge blocking layer 952 that includes charge centers 946 that form a floating plate or a charge storing medium, and an injector layer 954. The gate stack dielectric is $SiO_2$, which has a dielectric constant of about 4. The injector layer 954 enhances the electric field by a factor of about 1.5 (1.5×). A programming voltage $VP_3$ of 5.5 to 6.5 V is applied to the control gate 930. The resulting average electric field $E_{AVG}$ between the charge centers 946 and the substrate 912 is reduced to about $4 \times 10^6$ V/cm.

Figure 10:
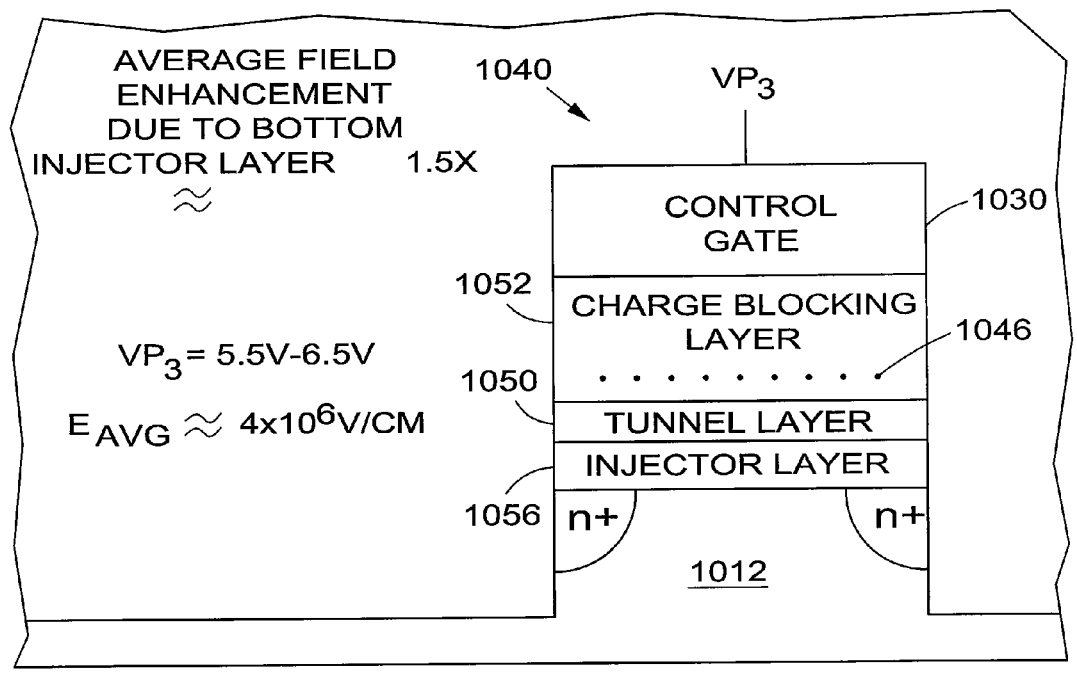
FIG. 10 illustrates the average field enhancement due to the incorporation of a bottom injection layer in a gate stack for a nonvolatile floating plate device.

FIG. 10 illustrates the average field enhancement due to the incorporation of a bottom injection layer in a gate stack for a nonvolatile floating plate device. In this illustration, the gate stack 1040, which is interposed between the control gate 1030 and the substrate 1012, includes an injector layer 1056, a tunnel layer 1050, and a charge blocking layer 1052 that includes charge centers 1046 that form a floating plate or a charge storing medium. The gate stack dielectric is $SiO_2$. A programming voltage $VP_3$ of 5.5 to 6.5 V is applied to the control gate 1030. The resulting average electric field $E_{AVG}$ between the charge centers 1046 and the substrate 1012 is reduced to about $4 \times 10^6$ V/cm. This illustrates that the same general results are achieved whether the injector layer is on top of the gate stack or on the bottom of the gate stack. That is, the injector layer enhances the electric field by a factor of about 1.5

Figure 11:
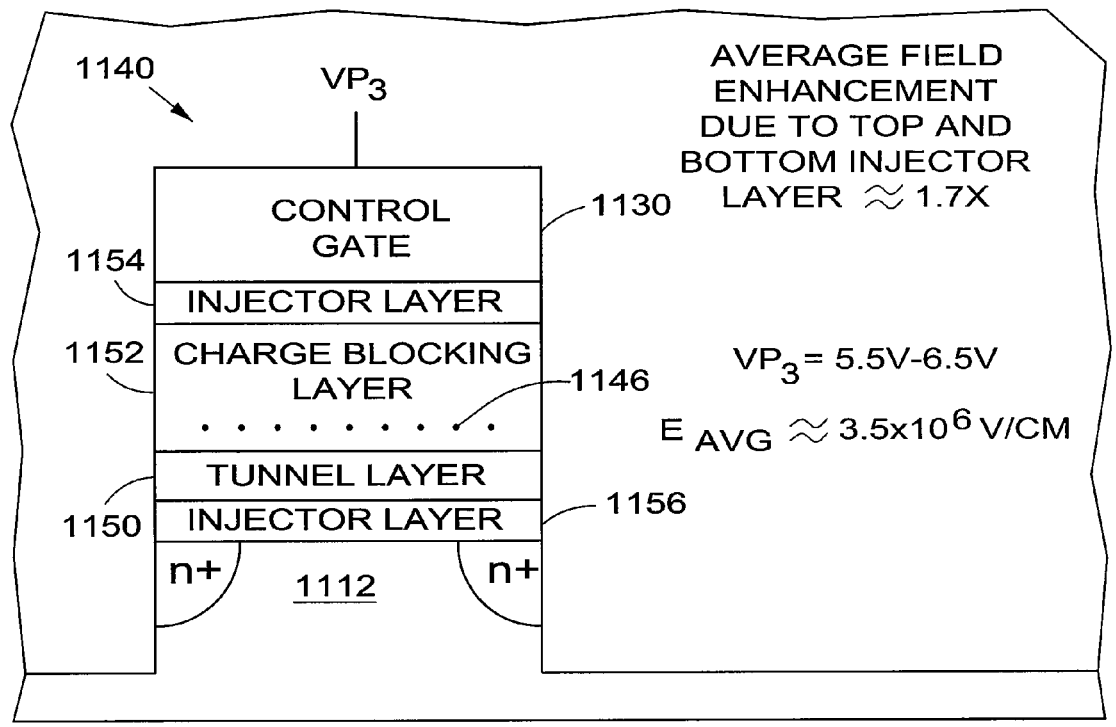
FIG. 11 illustrates the average field enhancement due to the incorporation of both a top injection layer and a bottom injection layer in a gate stack for a nonvolatile floating plate device.

FIG. 11 illustrates the average field enhancement due to the incorporation of both a top injection layer and a bottom injection layer in a gate stack for a nonvolatile floating plate device. In this illustration, the gate stack 1140, which is interposed between the control gate 1130 and the substrate 1112, includes a first injector layer 1156, a tunnel layer 1150, a charge blocking layer 1152 that includes charge centers 1146 that form a floating plate or a charge storing medium, and a second injector layer 1154. The gate stack dielectric is $SiO_2$. The use of an injector layer on the top and on the bottom of the gate stack enhances the electric field by a factor of about 1.7 (1.7×). A programming voltage $VP_3$ of 5.5 to 6.5 V is applied to the control gate 1130. The resulting average electric field $E_{AVG}$ between the charge centers 1146 and the substrate 1112 is reduced to about $3.5 \times 10^6$ V/cm.

Figure 12:
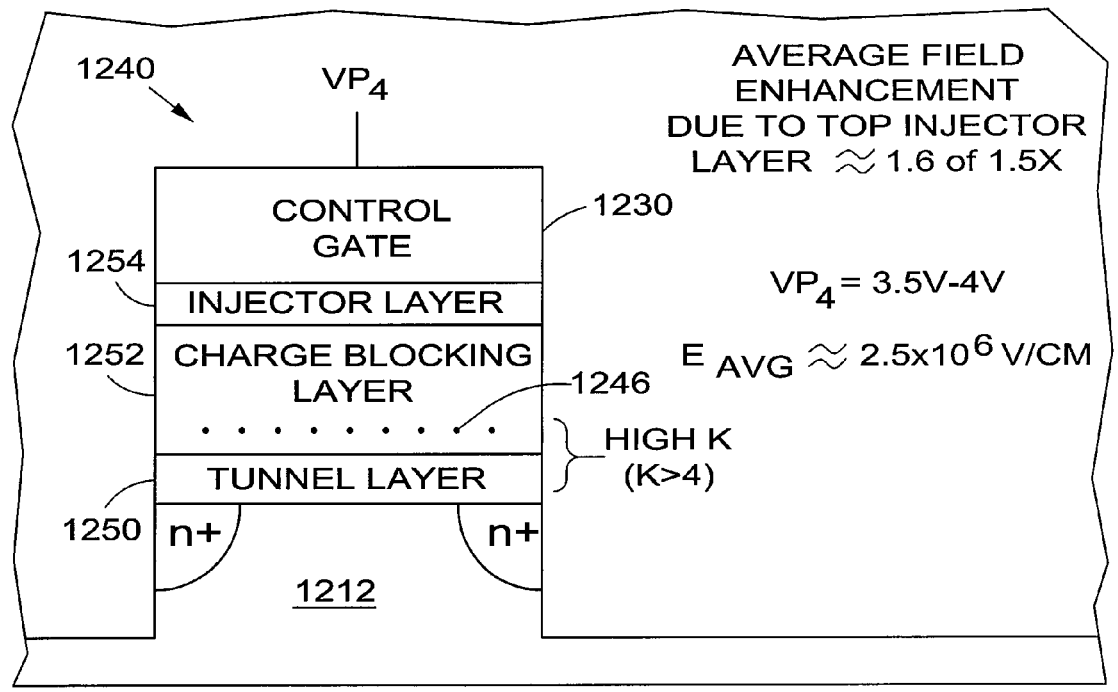
FIG. 12 illustrates the average field enhancement due to the incorporation of a high K dielectric and a top injection layer in a gate stack for a nonvolatile floating plate device.
Figure 13:
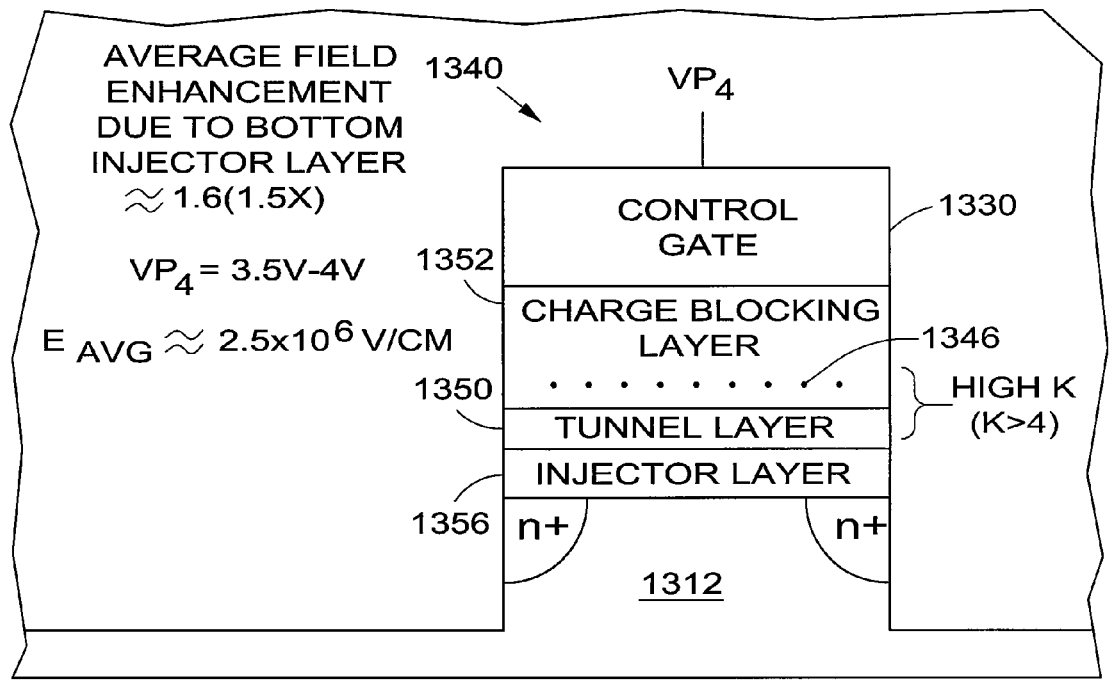
FIG. 13 illustrates the average field enhancement due to the incorporation of a high K dielectric and a bottom injection layer in a gate stack for a nonvolatile floating plate device.
Figure 14:
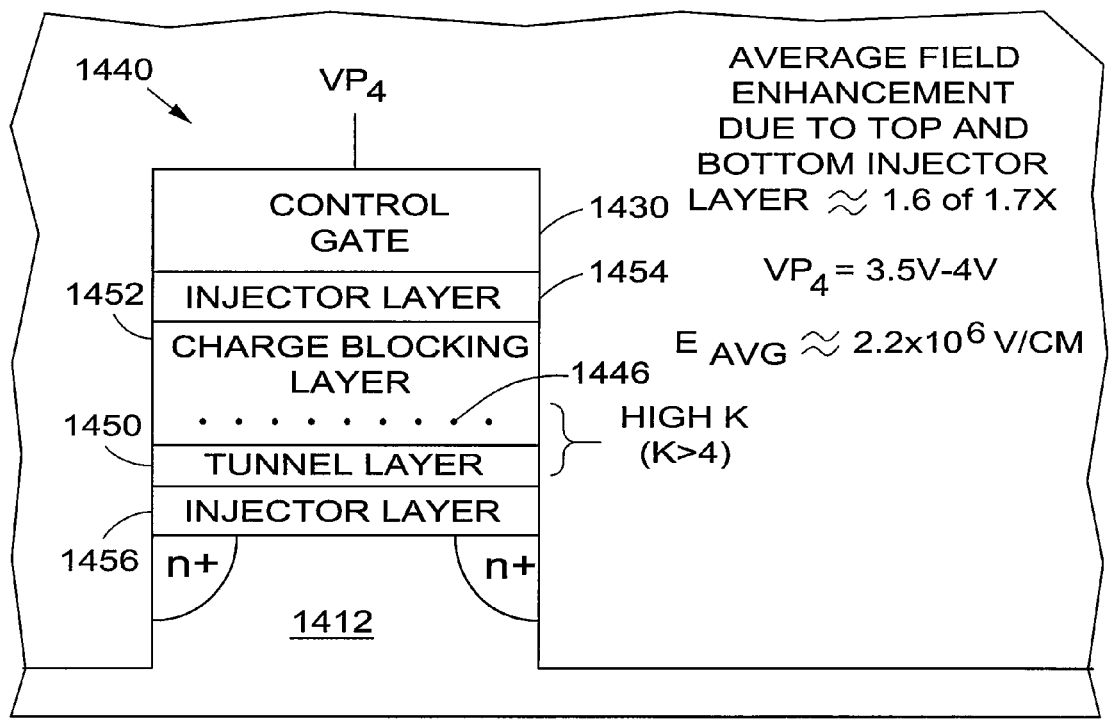
FIG. 14 illustrates the average field enhancement due to the incorporation of a high K dielectric and both a top injection layer and a bottom injection layer in a gate stack for a nonvolatile floating plate device.

FIGS. 12, 13 and 14 correspond with the illustrations of FIGS. 9, 10 and 11, except that a high K dielectric such as $Al_2O_3$ (K=9-10) is used in the gate stack rather than $SiO_2$ (K=4). For example, the illustrations show a high K dielectric is used as the base dielectric for both the charge blocking layer and the tunnel layer. The high K dielectric allows the device to be scaled to smaller sizes and allows smaller electric fields and programming voltages to be applied.

FIG. 12 illustrates the average field enhancement due to the incorporation of a high K dielectric and a top injection layer in a gate stack for a nonvolatile floating plate device. The average field enhancement due to the $Al_2O_3$ is approximately 1.6 greater than that for the illustration of FIG. 9 that used $SiO_2$ as the gate dielectric; i.e. the average field enhancement is approximately 1.6 of 1.5×. A programming voltage $VP_4$ of 3.5 to 4 V is applied to the control gate 1230. The resulting average electric field $E_{AVG}$ between the charge centers 1246 and the substrate 1212 is, therefore, reduced to about $2.5 \times 10^6$ V/cm.

FIG. 13 illustrates the average field enhancement due to the incorporation of a high K dielectric and a bottom injection layer in a gate stack for a nonvolatile floating plate device. The average field enhancement due to the $Al_2O_3$ is approximately 1.6 times greater than that for the illustration of FIG. 10 that used $SiO_2$ as the gate dielectric; i.e. the average field enhancement is approximately 1.6 of 1.5×. A programming voltage $VP_4$ of 3.5 to 4 V is applied to the control gate 1330. The resulting average electric field $E_{AVG}$ between the charge centers 1346 and the substrate 1312 is reduced to about $2.5 \times 10^6$ V/cm.

FIG. 14 illustrates the average field enhancement due to the incorporation of a high K dielectric and both a top injection layer and a bottom injection layer in a gate stack for a nonvolatile floating plate device. The average field enhancement due to the $Al_2O_3$ is approximately 1.6 times greater than that for the illustration of FIG. 11 that used $SiO_2$ as the gate dielectric; i.e. the average field enhancement is approximately 1.6 of 1.7×. A programming voltage $VP_4$ of 3.5 to 4 V is applied to the control gate 1430. The resulting average electric field $E_{AVG}$ between the charge centers 1446 and the substrate 1412 is reduced to about $2.2 \times 10^6$ V/cm.

Figure 15:
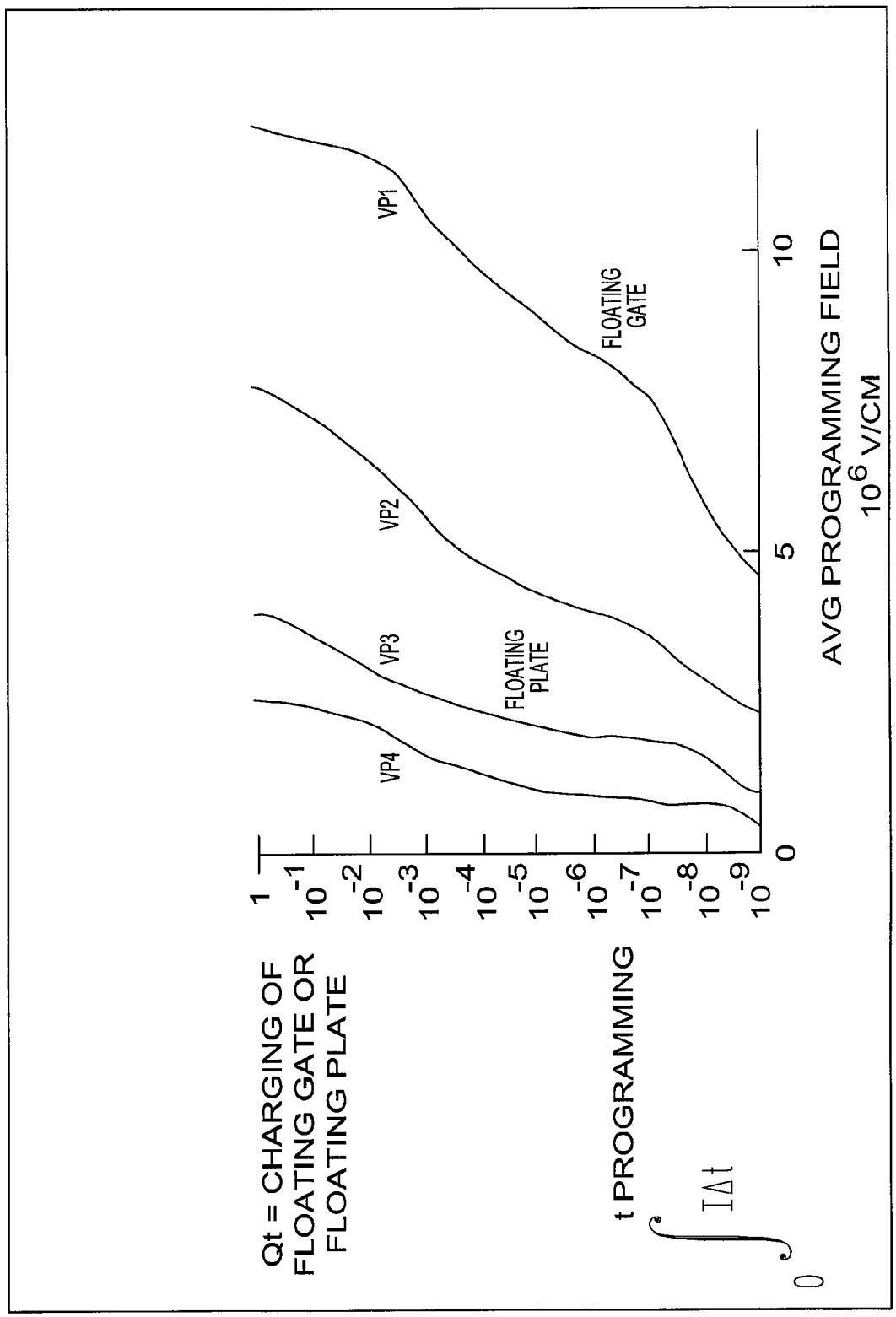
FIG. 15 is a graph showing floating charge versus average programming field for programming voltages applied to a floating gate of a conventional flash device (VP1), a NV floating plate device (VP2), a NV floating device having a gate stack formed with a single injection layer (VP3), and a NV floating device having a gate stack formed with a high K dielectric and a single injection layer (VP4).

FIG. 15 is a graph showing floating charge versus average programming field for programming voltages applied to a floating gate of a conventional flash device (VP1), a NV floating plate device (VP2), a NV floating device having a gate stack formed with a single injection layer (VP3), and a NV floating device having a gate stack formed with a high K dielectric and a single injection layer (VP4). The graph illustrates that a larger electric field is required to store a desired charge on a floating gate rather than on one of the floating plates. Reducing the required average programming field reduces the required programming voltage, which allows the NV device to be scaled with the other devices. Additionally, reducing the required programming voltage provides a margin with respect to the breakdown of the dielectric. A higher than required programming voltage can be applied to provide a quicker write or erase. Furthermore, for a generic write or erase speed, such reduction in programming voltage enhances endurance; i.e. the number of write/erase cycles.

Figure 16:
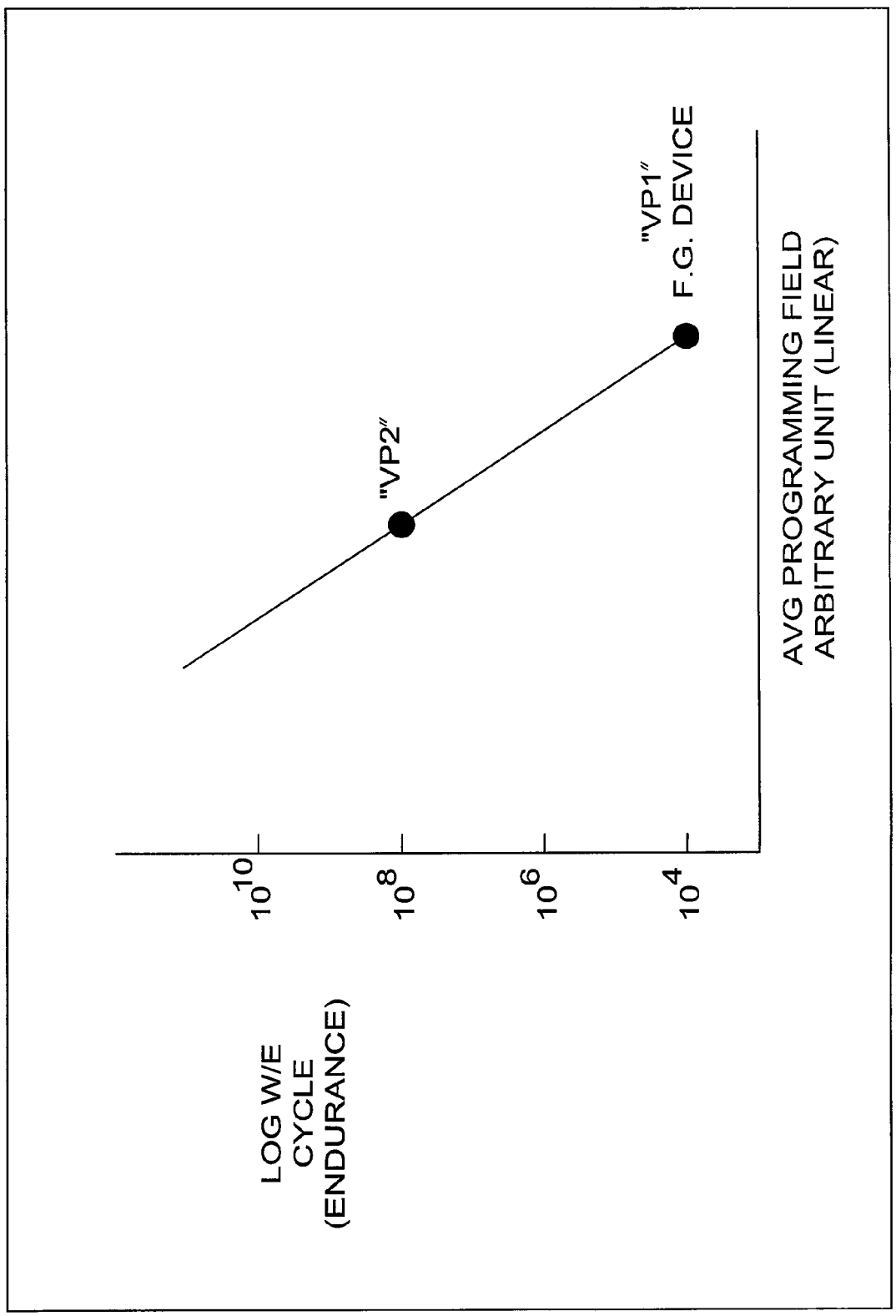
FIG. 16 is a graph showing the relationship between the log of the write/erase cycle, or endurance, and the average programming field.

FIG. 16 is a graph showing the relationship between the log of the write/erase cycle, or endurance, and the average programming field. The graph illustrates a linear relationship between the average programming field and endurance such that reducing the average programming field in half increases the endurance by almost four orders of magnitude, and reducing the average programming field to one fourth of an original field increases the endurance by almost eight orders of magnitude, i.e. by a factor of 100,000,000.

Figure 17:
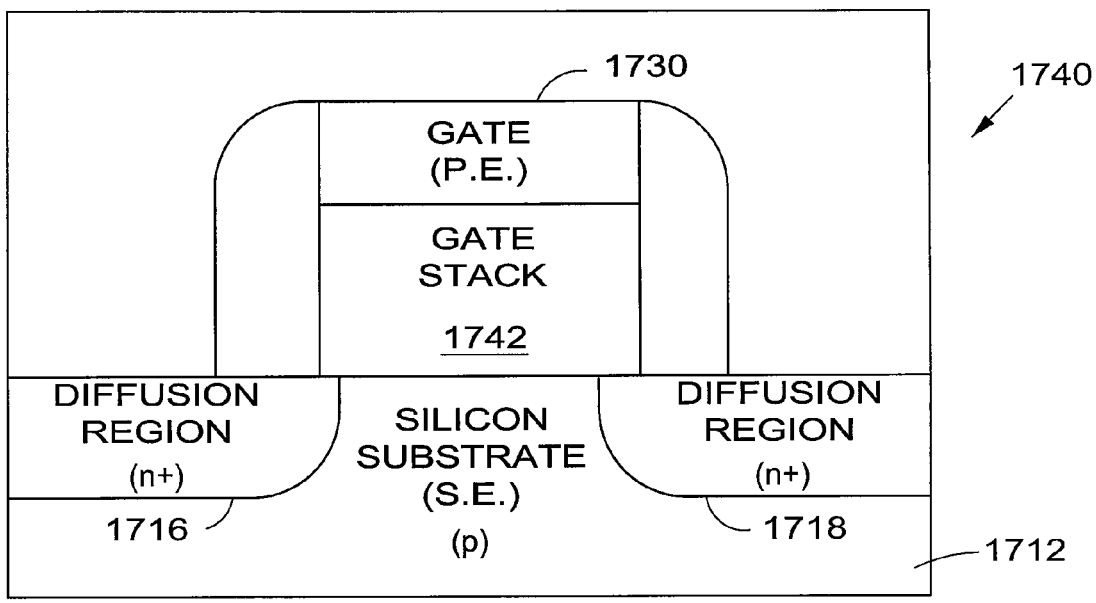
FIG. 17 is one embodiment of a NV floating plate device.

FIG. 17 is one embodiment of a NV floating plate device. The device 1740 includes a gate stack 1742 that is formed on a p-type silicon substrate 1712 between two n-type diffusion regions 1716 and 1718 in the substrate. A gate 1730 is formed on the gate stack 1742. The diffusion regions in the illustrated embodiment are n+ diffusion regions, and the substrate is a p substrate. In this embodiment, the substrate functions as a source electrode (S.E.) and the gate functions as a programming electrode (P.E.). One of ordinary skill in the art will understand, upon reading and understanding this disclosure, how to reverse the roles of the electrodes to provide the desired device operation. For example, the role of the electrodes could be reversed by placing the tunnel media either adjacent to the silicon substrate or to the gate. The gate may be either a doped polysilicon gate such as a n+ or p+ diffused silicon, or may be a metal gate. Examples of a metal gate include TiN and WSi. One of ordinary skill in the art will understand, upon reading and understanding this disclosure, how to incorporate the gate stack into both bulk and SOI silicon based microelectronics technology, including NMOS, PMOS and CMOS technology. The CMOS technology could either be bulk CMOS or SOI CMOS technology.

Figure 18:
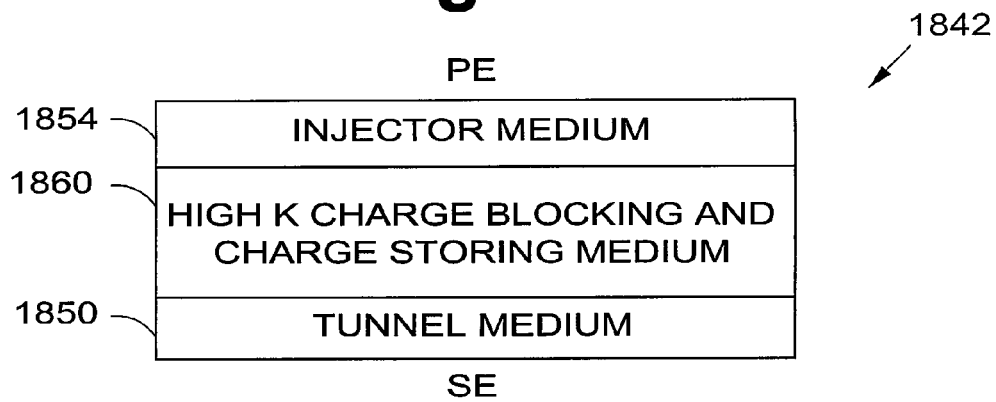
FIG. 18 is one embodiment of a single injector layer gate stack for the NV floating plate device of FIG. 17.

FIG. 18 is one embodiment of a single injector layer gate stack or single electron injector structure (SEIS) for the NV floating plate device of FIG. 17. From the source electrode to the program electrode, the gate stack 1842 includes a tunnel medium 1850, a combination high K charge blocking and charge storing medium 1860, and an injector medium 1854. The injector medium 1854 provides charge transfer through enhanced tunneling. The term charge storing medium connotes a medium that has charge centers that provide a charge trapping property. According to one embodiment, the combination high K charge blocking and charge storing medium 1860 includes nano crystals dispersed into a high K dielectric either through doping or implantation.

Figure 19:
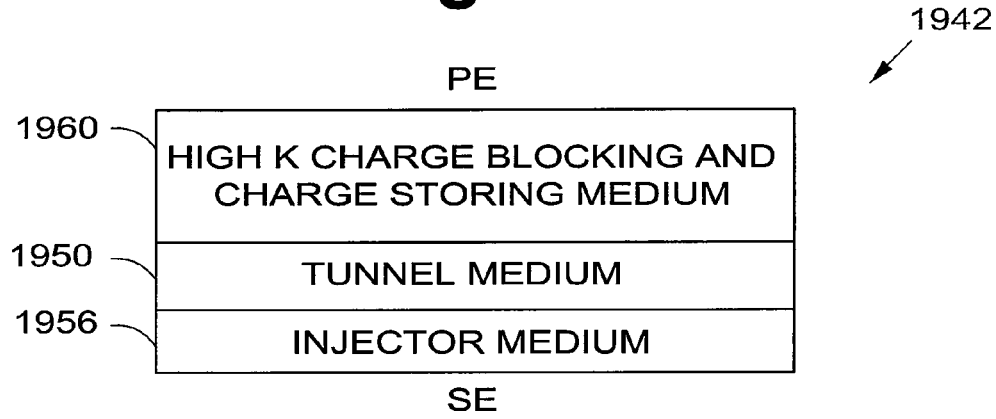
FIG. 19 is one embodiment of a single injector layer gate stack for the NV floating plate device of FIG. 17.

FIG. 19 is one embodiment of a single injector layer gate stack or single electron injector structure (SEIS) for the NV floating plate device of FIG. 17. From the source electrode to the program electrode, the gate stack 1942 includes an injector medium 1956, a tunnel medium 1950, and a combination high K charge blocking and charge storing medium 1960. This illustrates that the injector medium may be used either as the top layer (near the program electrode) or as the bottom layer (near the source electrode) of the gate structure. According to one embodiment, the combination high K charge blocking and charge storing medium 1960 includes nano crystals dispersed into a high K dielectric either through doping or implantation.

Figure 20:
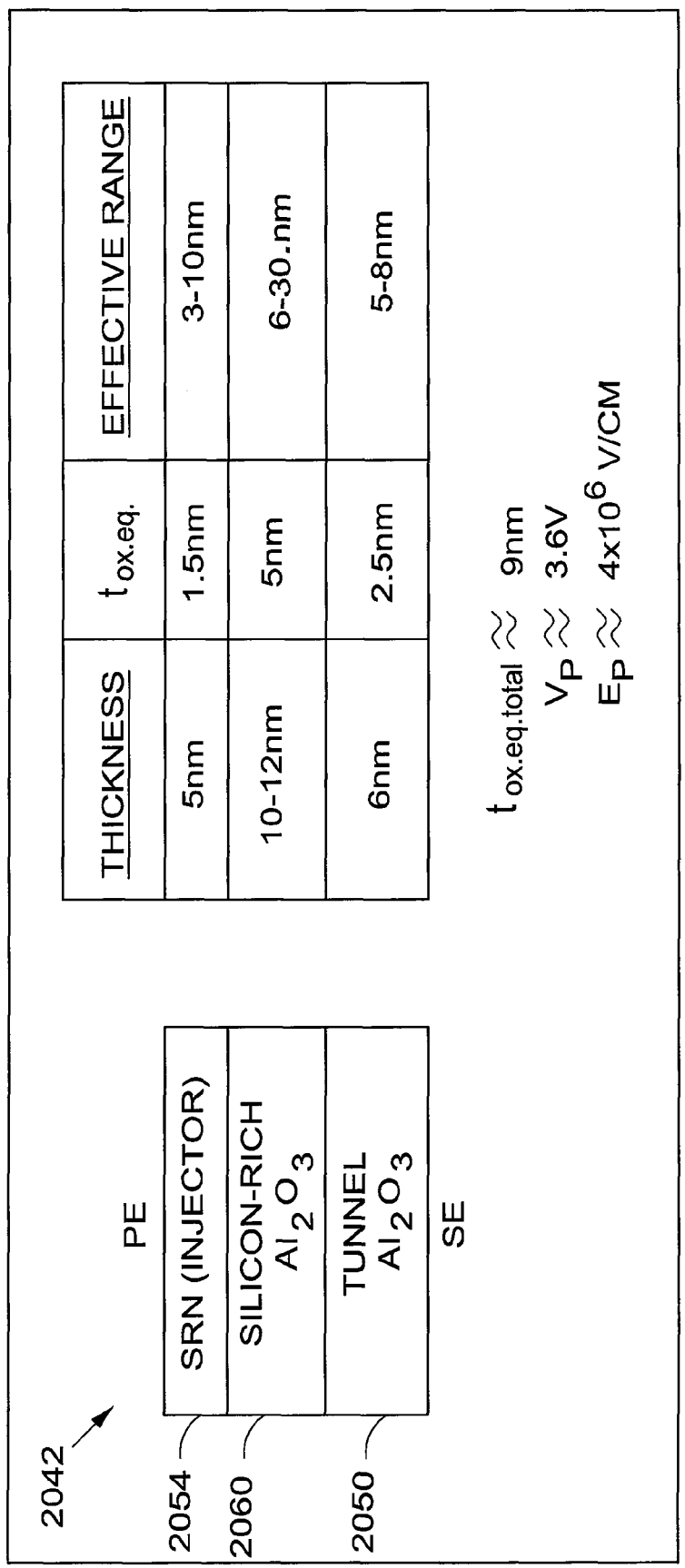
FIG. 20 is one embodiment of the single injector layer gate stack of FIG. 18.

FIG. 20 is one embodiment of the single injector layer gate stack or single electron injector structure (SEIS) of FIG. 18. From the source electrode to the program electrode, the gate stack 2042 includes an $Al_2O_3$ tunnel medium 2050, silicon-rich $Al_2O_3$ 2060 functioning as the combination high K charge blocking and charge storing medium, and an SRN injector medium 2054. Silicon-rich $Al_2O_3$ 2060 includes dispersed silicon nano crystals to provide the medium with a refractive index sufficient to provide charge centers that trap or store charge.

In this embodiment, as is represented by the chart adjacent to the gate stack, the thickness of the tunnel $Al_2O_3$ is 6 nm which corresponds to a $t_{OX}$ equivalent of about 2.5 nm, the thickness of the silicon-rich $Al_2O_3$ is 10 to 12 nm which corresponds to a $t_{OX}$ equivalent of about 5 nm, and the thickness of the injector SRN is 5 nm which corresponds to a $t_{OX}$ equivalent of about 1.5 nm. The total equivalent oxide thickness ($t_{OX.EQ.TOTAL}$) is approximately 9 nm. A programming voltage ($V_P$) of 3.6 V provides an effective programming field ($E_P$) of about $4 \times 10^6$ V/cm. A number of variables may be manipulated. An effective range for the $Al_2O_3$ tunnel medium is 3 to 10 nm, for the silicon-rich $Al_2O_3$ is 6 to 30 nm, and for the SRN injector medium is 3 to 10 nm. One of ordinary skill in the art will understand, upon reading and understanding this disclosure, how to manipulate these variables to achieve the desired characteristics for the gate stack.

Figure 21:
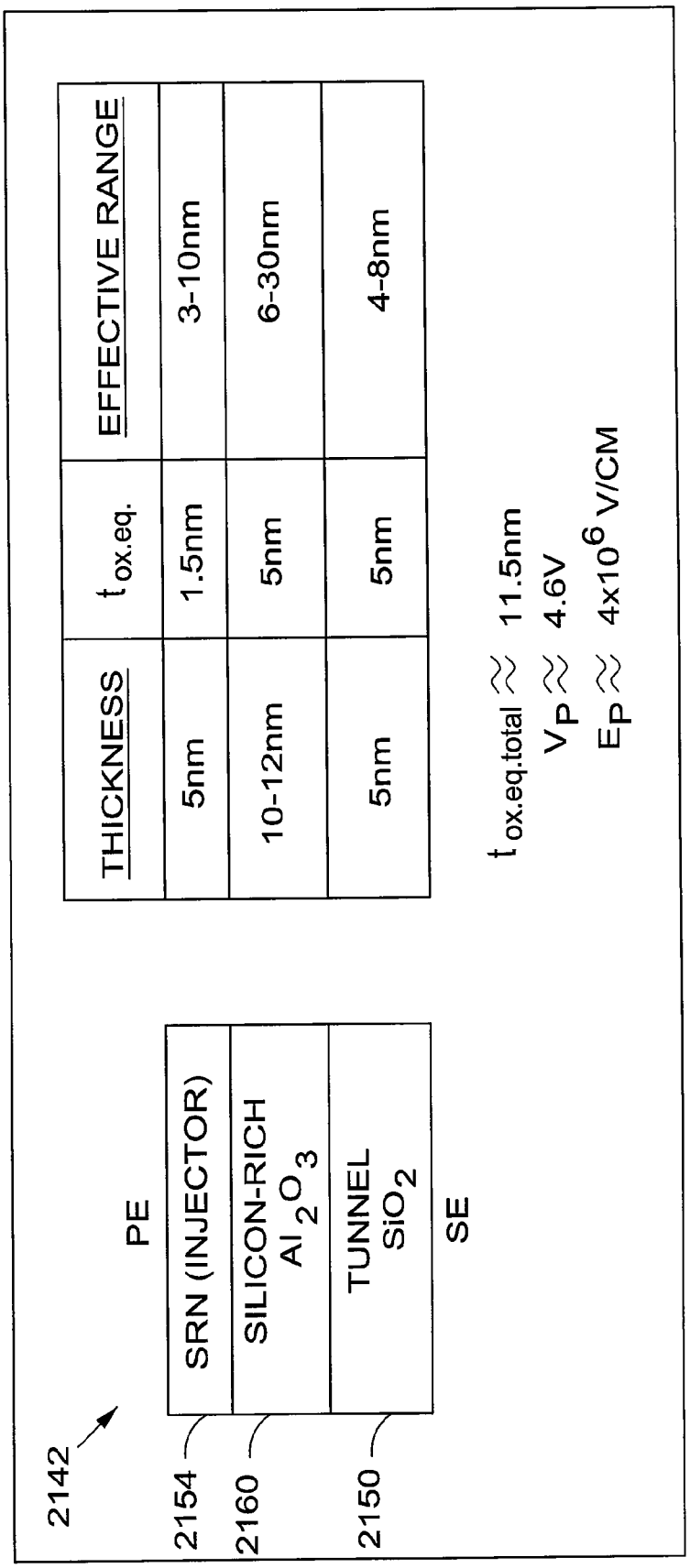
FIG. 21 is one embodiment of the single injector layer gate stack of FIG. 18.

FIG. 21 is one embodiment of the single injector layer gate stack of FIG. 18. From the source electrode to the program electrode, the gate stack 2142 includes a $SiO_2$ tunnel medium 2150, silicon rich $Al_2O_3$ 2160 functioning as the combination high K charge blocking and charge storing medium, and an SRN injector medium 2154.

In this embodiment, as is represented by the chart adjacent to the gate stack, the thickness of the tunnel $SiO_2$ is 5 nm which corresponds to a $t_{OX}$ of about 5 nm, the thickness of the silicon-rich $Al_2O_3$ is 10 to 12 nm which corresponds to a $t_{OX}$ equivalent of about 5 nm, and the thickness of the injector SRN is 5 nm which corresponds to a $t_{OX}$ equivalent of about 1.5 nm. The total equivalent oxide thickness ($t_{OX.EQ.TOTAL}$) is approximately 11.5 nm. A programming voltage ($V_P$) of 4.6 V provides an effective programming field ($E_P$) of about $4 \times 10^6$ V/cm. A number of variables may be manipulated. An effective range for the $SiO_2$ tunnel medium is 4 to 8 nm, for the silicon-rich $Al_2O_3$ is 6 to 30 nm, and for the SRN injector medium is 3 to 10 nm. One of ordinary skill in the art will understand, upon reading and understanding this disclosure, how to manipulate these variables to achieve the desired characteristics for the gate stack.

Figure 22:
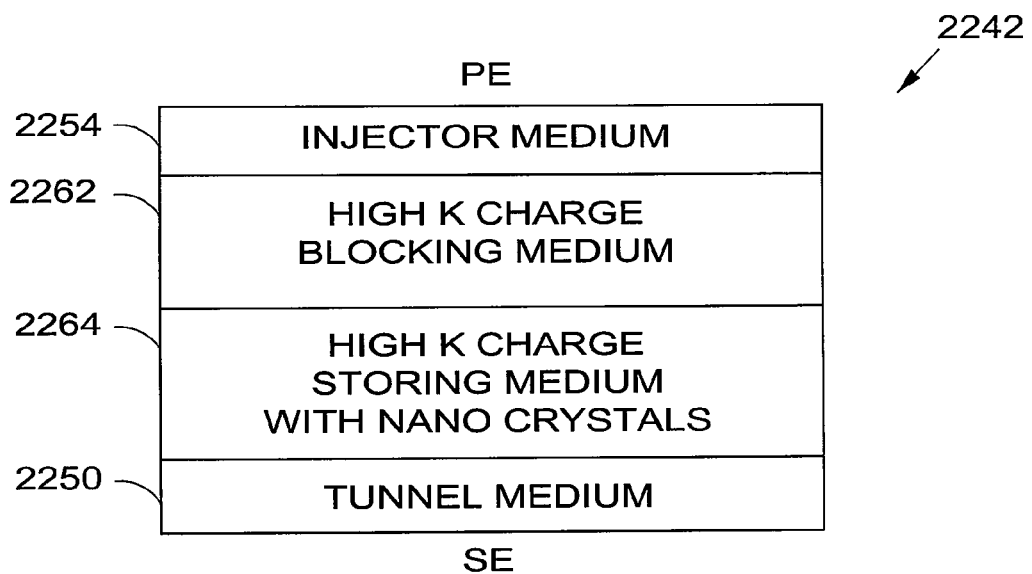
FIG. 22 is one embodiment of a single injector layer gate stack for the NV floating plate device of FIG. 17.

FIG. 22 is one embodiment of a single injector layer gate stack or single electron injector structure (SEIS) for the NV floating plate device of FIG. 17. From the source electrode to the program electrode, the gate stack 2242 includes a tunnel medium 2250, a charge storing medium 2264 with nano crystals, a high K charge blocking medium 2262, and an injector medium 2254. According to one embodiment, the nano crystals in the charge storing medium are disposed in a high K dielectric either through doping or implantation.

Figure 23:
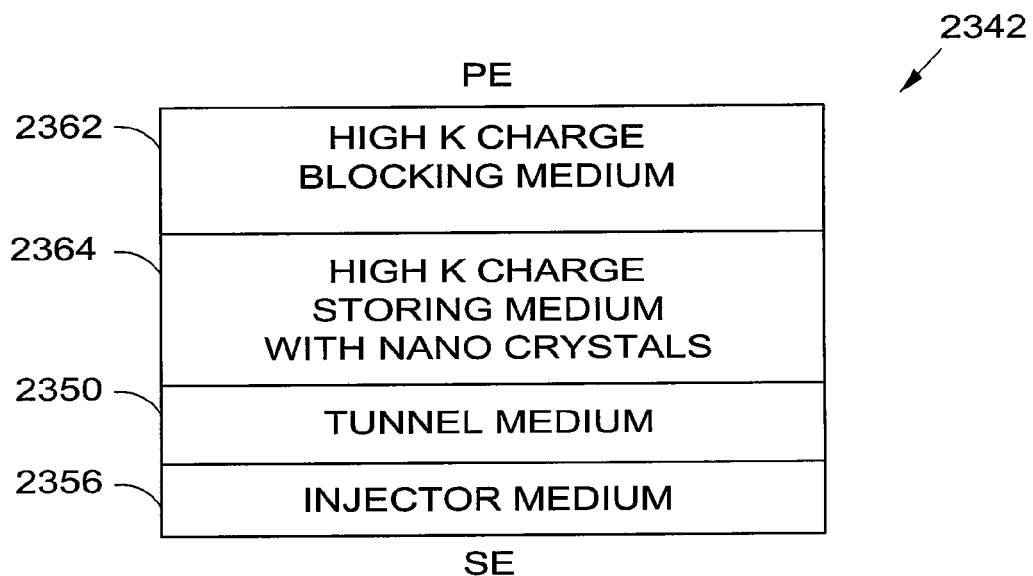
FIG. 23 is one embodiment of a single injector layer gate stack for the NV floating plate device of FIG. 17.

FIG. 23 is one embodiment of a single injector layer gate stack or single electron injector structure (SEIS) for the NV floating plate device of FIG. 17. From the source electrode to the program electrode, the gate stack 2342 includes an injector medium 2356, a tunnel medium 2350, a charge storing medium 2364 with nano crystals, and a high K charge blocking medium 2362. According to one embodiment, the nano crystals in the charge storing medium are disposed in a high K dielectric either through doping or implantation.

Figure 24:
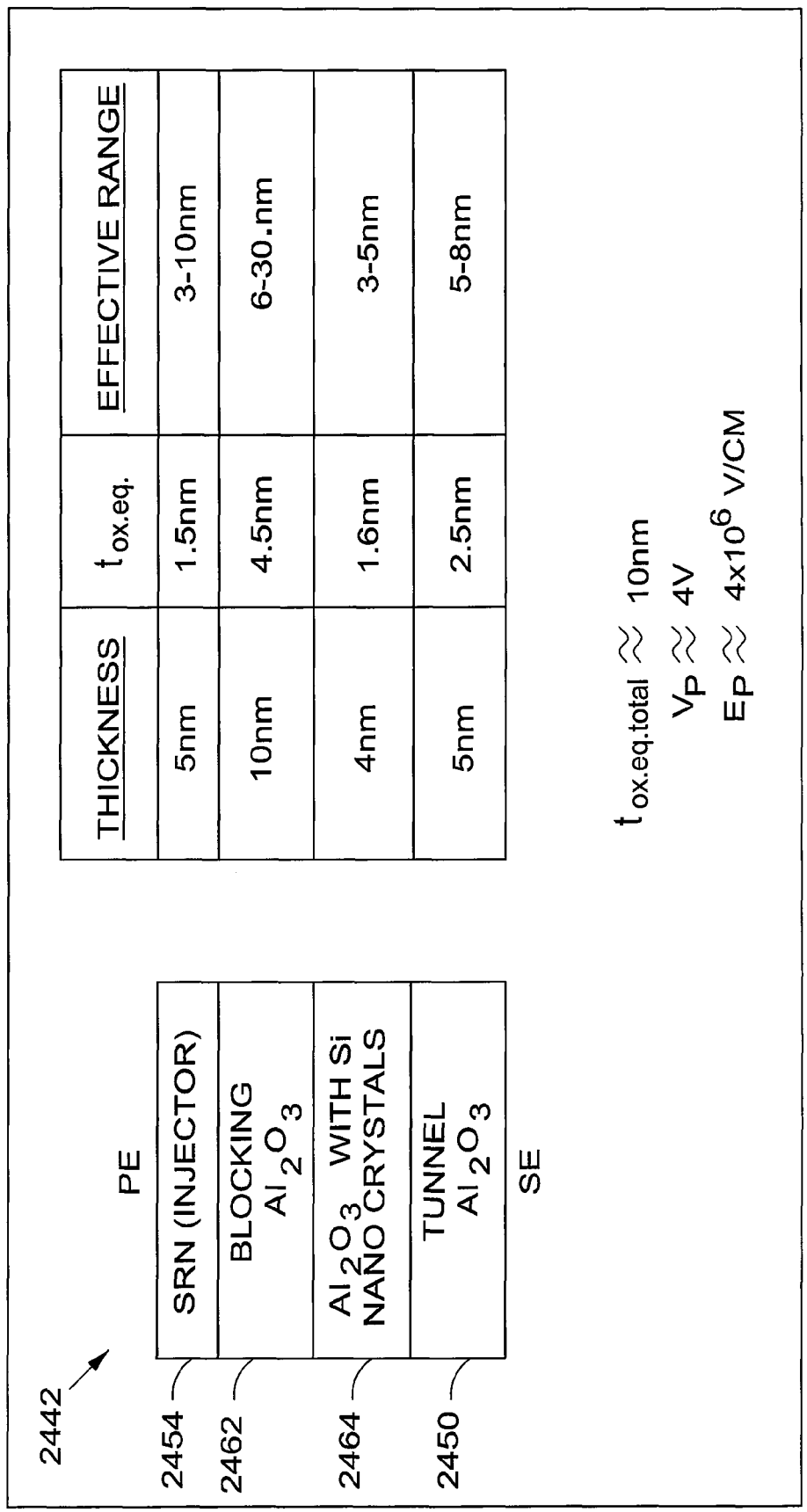
FIG. 24 is one embodiment of the single injector layer gate stack of FIG. 23.

FIG. 24 is one embodiment of the single injector layer gate stack of FIG. 22. From the source electrode to the program electrode, the gate stack 2442 includes an $Al_2O_3$ tunnel medium 2450, $Al_2O_3$ with silicon nano crystals 2464 functioning as a charge storing medium, $Al_2O_3$ 2462 functioning as a high K charge blocking medium, and an SRN injector medium 2454.

In this embodiment, as is represented by the chart adjacent to the gate stack, the thickness of the tunnel $Al_2O_3$ is 5 nm which corresponds to a $t_{OX}$ equivalent of about 2.5 nm, the thickness of the $Al_2O_3$ with silicon nano crystals is 4 nm which corresponds to a $t_{OX}$ equivalent of about 1.6 nm, the thickness of the blocking $Al_2O_3$ is 10 nm which corresponds to a $t_{OX}$ equivalent of about 4.5 nm, and the thickness of the injector SRN is 5 nm which corresponds to a $t_{OX}$ equivalent of about 1.5 nm. The total equivalent oxide thickness ($t_{OX.EQ.TOTAL}$) is approximately 10 nm. A programming voltage ($V_P$) of 4 V provides an effective programming field ($E_P$)

of about 4×10⁶ V/cm. A number of variables may be manipulated. An effective range for the $Al_2O_3$ tunnel medium is 5 to 8 nm, for the $Al_2O_3$ with silicon nano crystals is 3 to 5 nm, for the blocking $Al_2O_3$ is 6 to 30 nm, and for the SRN injector medium is 3 to 10 nm. One of ordinary skill in the art will understand, upon reading and understanding this disclosure, how to manipulate these variables to achieve the desired characteristics for the gate stack.

Figure 25:
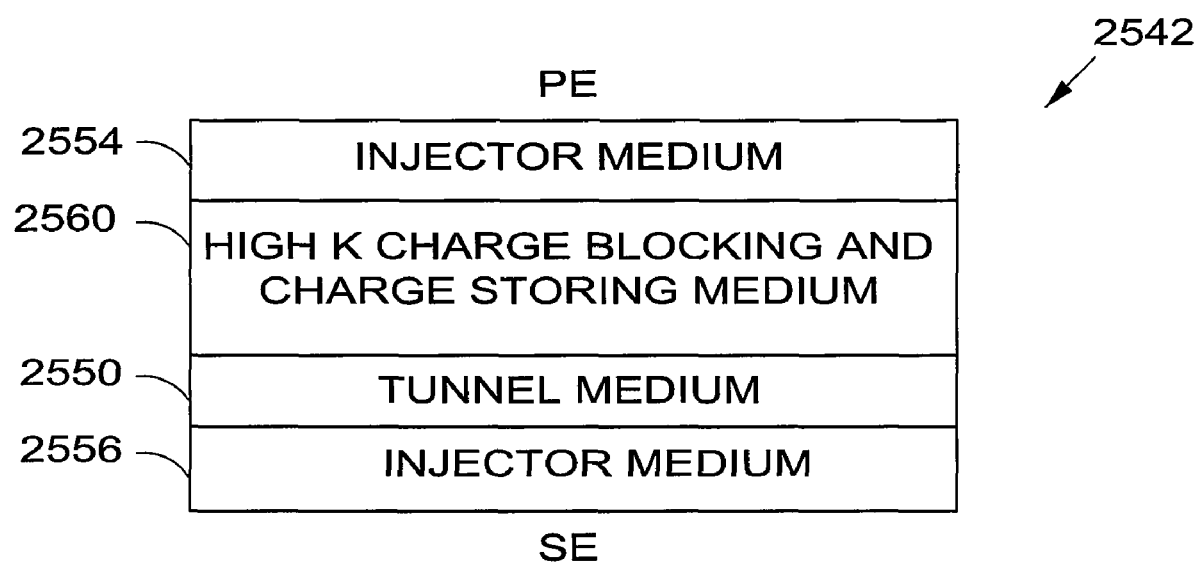
FIG. 25 is one embodiment of a double injector layer gate stack for the NV floating plate device of FIG. 17.

FIG. 25 is one embodiment of a double injector layer gate stack or double electron injector structure (DEIS) for the NV floating plate device of FIG. 17. From the source electrode to the program electrode, the gate stack 2542 includes an injector medium 2556, a tunnel medium 2550, a combination charge blocking and storing medium 2560, and an injector medium 2554. The use of two injector layers provides further field enhancements as provided above.

Figure 26:
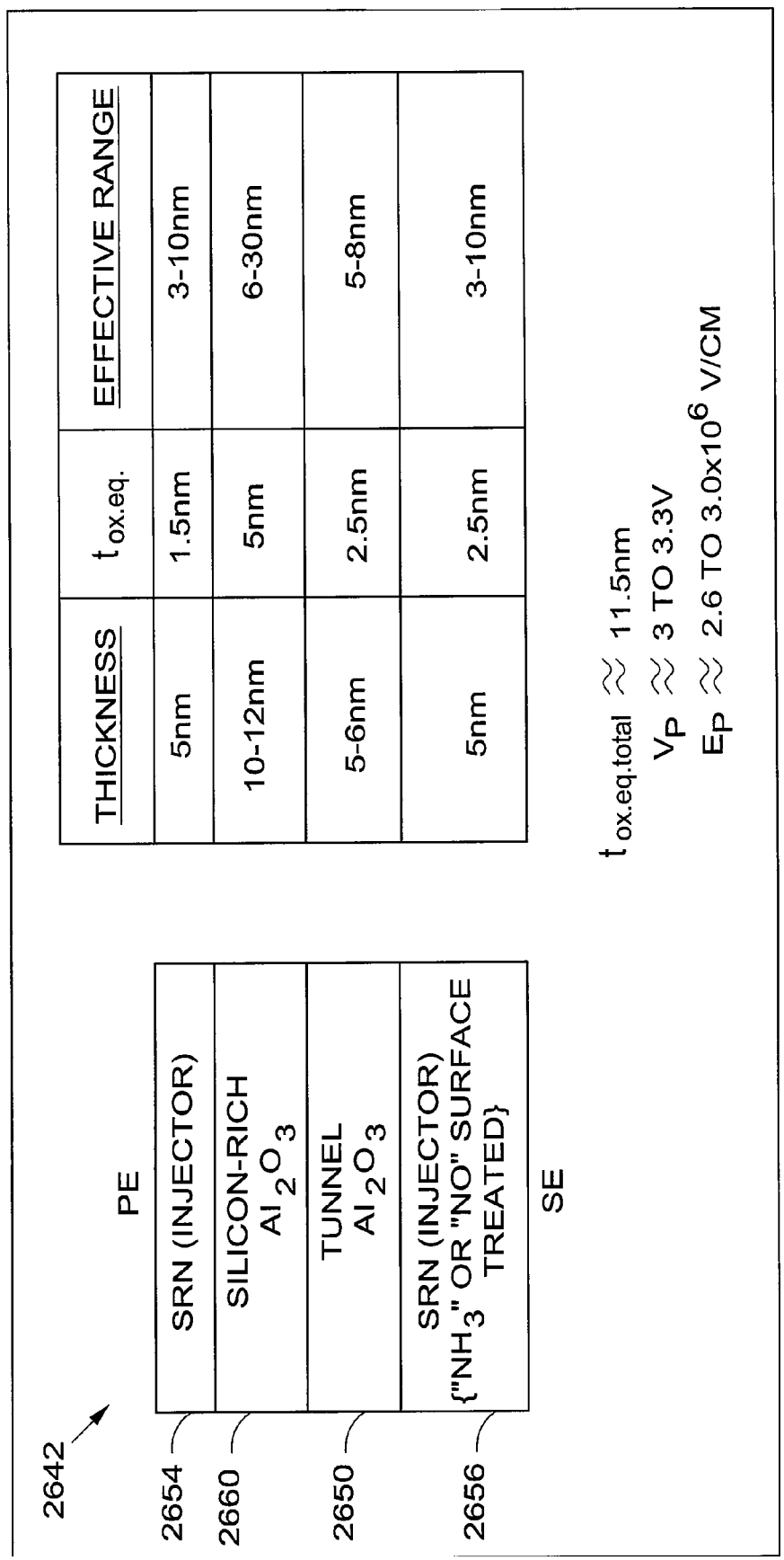
FIG. 26 is one embodiment of the double injector layer gate stack of FIG. 25.

FIG. 26 is one embodiment of the double injector layer gate stack of FIG. 25. From the source electrode to the program electrode, the gate stack 2642 includes an SRN injector medium 2656, an $Al_2O_3$ tunnel medium 2650, silicon rich $Al_2O_3$ 2660 functioning as the combination high K charge blocking and charge storing medium, and an SRN injector medium 2654.

In this embodiment, as is represented by the chart adjacent to the gate stack, the thickness of the first injector SRN that is deposited "$NH_3$" or "NO" surface treated substrate is 5 nm which corresponds to a $t_{OX}$ equivalent of about 2.5 nm, the thickness of the tunnel $Al_2O_3$ is 5 to 6 nm which corresponds to a $t_{OX}$ equivalent of about 2.5 nm, the thickness of the silicon-rich $Al_2O_3$ is 10 to 12 nm which corresponds to a $t_{OX}$ equivalent of about 5 nm, and the thickness of the second injector SRN is 5 nm which corresponds to a $t_{OX}$ equivalent of about 1.5 nm. The total equivalent oxide thickness ($t_{OX.EQ.TOTAL}$) is approximately 11.5 nm. A programming voltage ($V_P$) of 3 to 3.3 V provides an effective programming field ($E_P$) of about 2.6 to 3.0×10⁶ V/cm. A number of variables may be manipulated. An effective range for the first SRN injector media is 3 to 10 nm, for the $Al_2O_3$ tunnel medium is 5 to 8 nm, for the silicon-rich $Al_2O_3$ is 6 to 30 nm, and for the second SRN injector medium is 3 to 10 nm. One of ordinary skill in the art will understand, upon reading and understanding this disclosure, how to manipulate these variables to achieve the desired characteristics for the gate stack.

Figure 27:
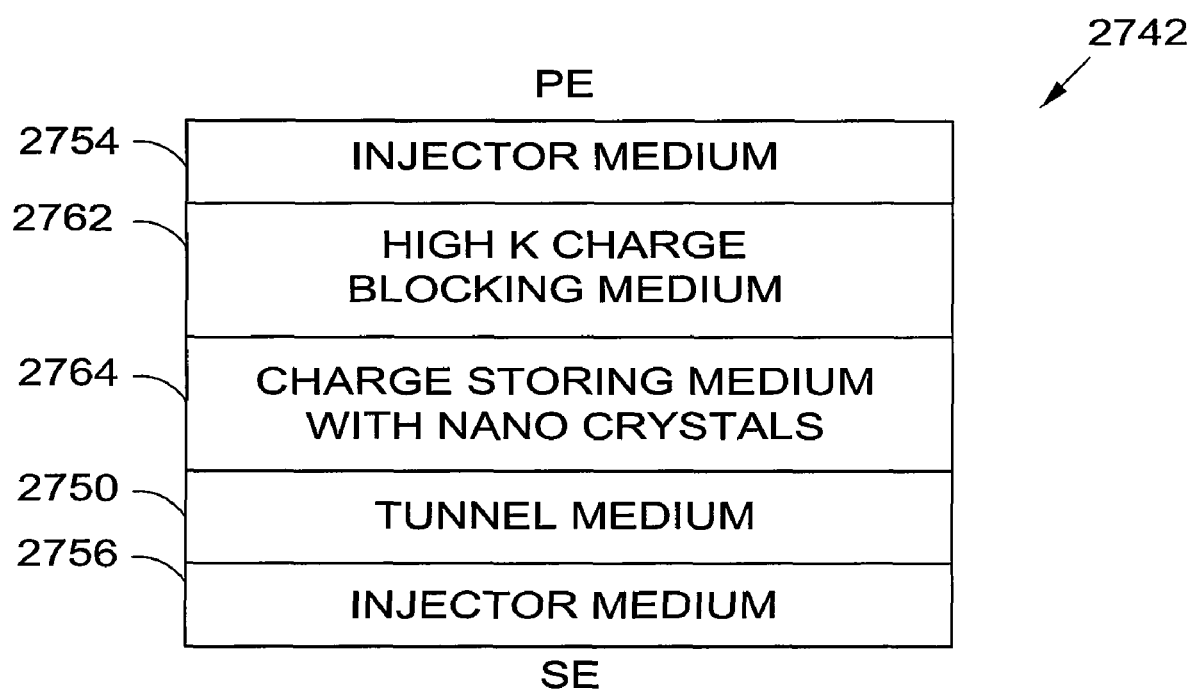
FIG. 27 is one embodiment of a double injector layer gate stack for the NV floating plate device of FIG. 17.

FIG. 27 is one embodiment of a double injector layer gate stack or double electron injector structure (DEIS) for the NV floating plate device of FIG. 17. From the source electrode to the program electrode, the gate stack 2742 includes an injector medium 2756, a tunnel medium 2750, a charge storing medium 2764, a charge blocking medium 2762, and an injector medium 2754.

Figure 28:
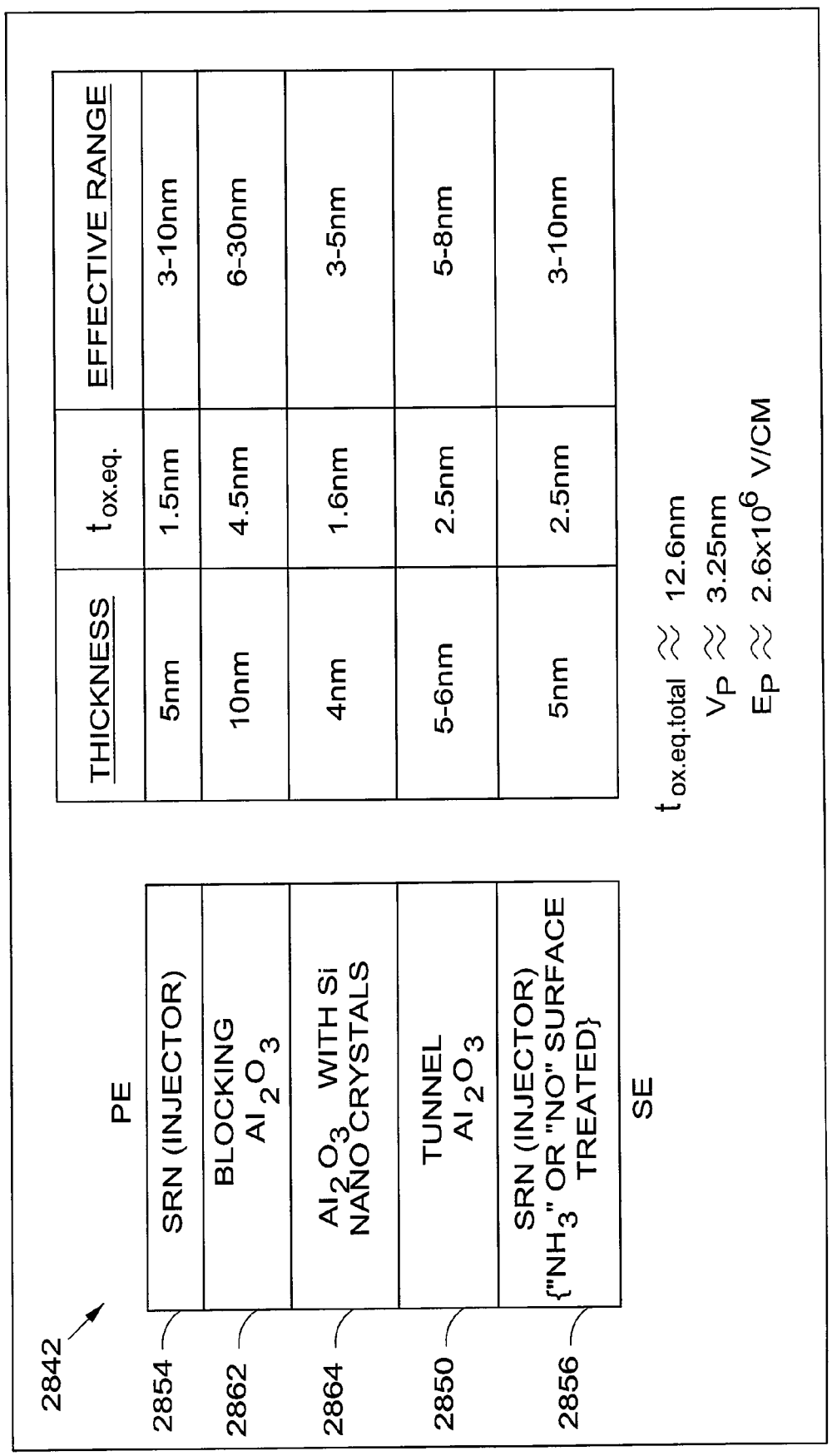
FIG. 28 is one embodiment of the double injector layer gate stack of FIG. 27.

FIG. 28 is one embodiment of the double injector layer gate stack of FIG. 27. From the source electrode to the program electrode, the gate stack 2842 includes an SRN injector medium 2856, an $Al_2O_3$ tunnel medium 2850, $Al_2O_3$ with silicon nano crystals 2864 functioning as a charge storing medium, $Al_2O_3$ functioning as a charge blocking medium 2862, and an SRN injector medium 2854.

In this embodiment, as is represented by the chart adjacent to the gate stack, the thickness of the first injector SRN that is deposited "$NH_3$" or "NO" surface treated substrate is 5 nm which corresponds to a $t_{OX}$ equivalent of about 2.5 nm, the thickness of the tunnel $Al_2O_3$ is 5 to 6 nm which corresponds to a $t_{OX}$ equivalent of about 2.5 nm, the thickness of the $Al_2O_3$ with silicon nano crystals is 4 mm which corresponds to a $t_{OX}$ equivalent of about 1.6 nm, the thickness of the blocking $Al_2O_3$ is 10 nm which corresponds to a $t_{OX}$ equivalent of about 4.5 nm, and the thickness of the injector SRN is 5 nm which corresponds to a $t_{OX}$ equivalent of about 1.5 nm. The total equivalent oxide thickness ($t_{OX.EQ.TOTAL}$) is approximately 12.6 nm. A programming voltage ($V_P$) of 3.25 V provides an effective programming field ($E_P$) of about 2.6×10⁶ V/cm. A number of variables may be manipulated. An effective range for the first SRN injector medium is 3 to 10 nm, for the $Al_2O_3$ tunnel medium is 5 to 8 nm, for the $Al_2O_3$ with silicon nano crystals is 3 to 5 nm, for the blocking $Al_2O_3$ is 6 to 30 nm, and for the second SRN injector medium is 3 to 10 nm. One of ordinary skill in the art will understand, upon reading and understanding this disclosure, how to manipulate these variables to achieve the desired characteristics for the gate stack.

Injector SRN was provided as an example of an injector medium in the above examples. One of ordinary skill in the art will understand, upon reading and understanding this disclosure, that other materials may be used as an injector medium. These materials include silicon-rich aluminum nitride and SRO. $Al_2O_3$ is not an effective diffusion barrier for certain dopants like phosphorus for an n+ gate. The injector media SRN and silicon-rich aluminum nitride function as a diffusion barrier for doped polysilicon gates to prevent phosphorous, for example, from diffusing into $Al_2O_3$. A diffusion barrier is not needed if a metal gate is used. When injector SRN is deposited over a silicon substrate, the substrate is "NO" or "$NH_3$" surface treated to reduce the interface states density and leakage at the silicon substrate. This surface treatment adds 1 nm to the equivalent of additional oxide thickness ($t_{OX.EQ}$) of the injector SRN. This thicker $t_{OX}$ equivalent is illustrated in FIG. 25, where the top injector SRN has a $t_{OX}$ equivalent of 1.5 nm and the bottom injector SRN deposited over "NO" or "$NH_3$" surface treated substrate has a $t_{OX}$ equivalent of 2.5 nm.

$Al_2O_3$ was provided as an example of a high K charge blocking medium in the above examples. One of ordinary skill in the art will understand, upon reading and understanding this disclosure, that other materials may be used as a high K charge medium. A high K charge medium is a material that has a K greater than the K of silicon. These materials include oxides, nitrides and silicates of Tantalum, Titanium, Zirconium, Hafnium and Praseodymium. Additionally, these materials may further be doped with complex high K dielectrics such as barium strontium titanate (BST), transition metal, and metal oxides such as tantalum pentoxide ($Ta_2O_5$), titanium dioxide ($TiO_2$), tantalum nitride (TaN), zirconium oxide ($ZrO_2$), and praseodymium oxide ($Pr_2O_3$).

Silicon rich $Al_2O_3$ was provided as an example of a combination high K charge blocking and charge storing medium in the above examples. One of ordinary skill in the art will understand, upon reading and understanding this disclosure, that other materials may be used as a combination high K charge blocking and charge storing medium. These materials include any of the high K charge blocking media provided above with nano crystals dispersed through the media. Various embodiments include a high K charge blocking media with silicon nano crystals, gold nano crystals, tungsten nano crystals, and/or silicided tungsten nano crystals.

In the examples provided above it was indicated that the nano crystals were dispersed into a high K dielectric either through doping or implantation. One of ordinary skill in the art will understand, upon reading and understanding this disclosure, that the nano crystals may be distributed using a number of techniques, including simultaneous sputtering, implantation, chemical vapor deposition, atomic layer deposition (ALD) and molecular beam epitaxy (MBE).

$Al_2O_3$ and $SiO_2$ were provided as examples of a tunnel medium in the above examples. These materials may be interchanged with each other. $Al_2O_3$ has a higher dielectric constant, whereas $SiO_2$ is easier to fabricate.

Figure 29:
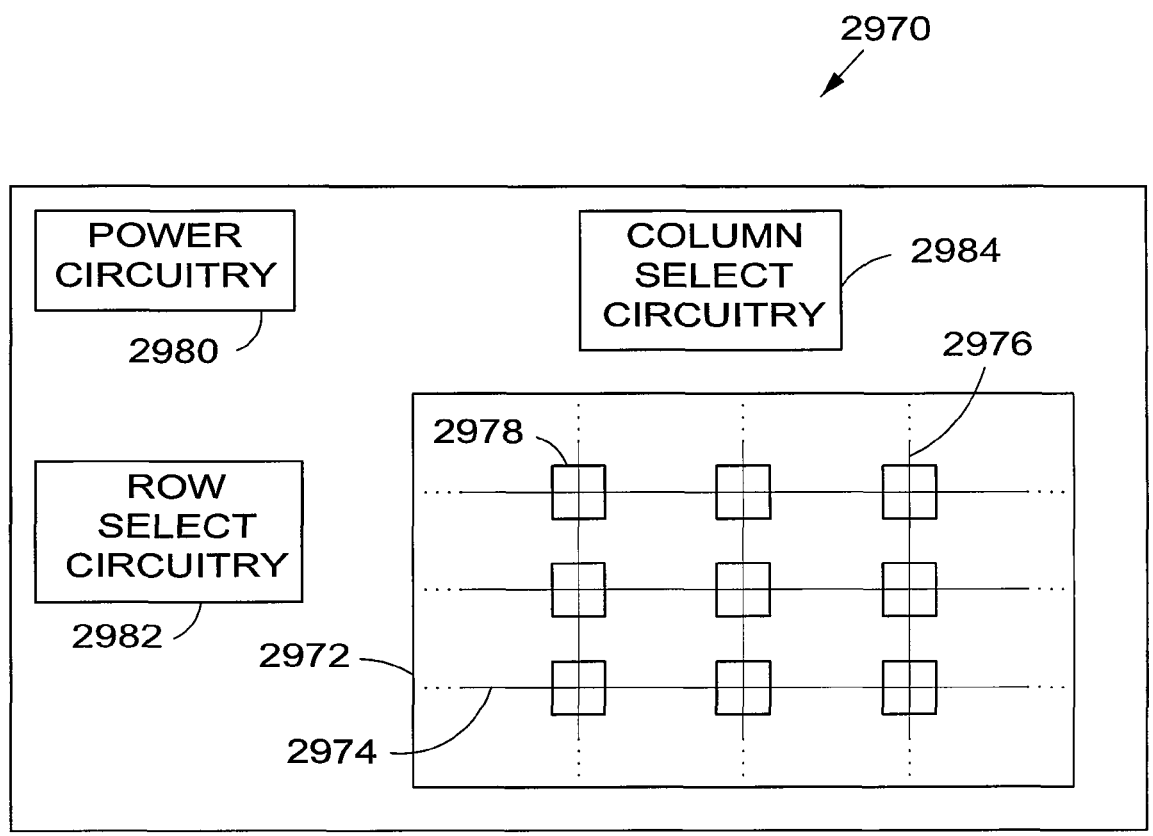
FIG. 29 illustrates a memory device with an array of NV memory cells according to the present invention.

FIG. 29 illustrates a memory device with an array of NV memory cells according to the present invention. The memory device 2970 includes an array 2972 of NV memory cells as described above. A grid of row conductors 2974 and column conductors 2976 are used to selectively write/erase a memory cell 2978. Additionally, the memory device 2970 includes power circuitry 2980, row select circuitry 2982 and column select circuitry 2984. The row select circuitry and column select circuitry cooperate with each other to select a memory cell to be written or erased using power provided by the power circuitry. Input/output circuitry and pads, not shown, defines the inputs and outputs of such device. According to various embodiments, the memory device is used in a number of nonvolatile multi-threshold FET devices such as PROM, FLASH, EPROM, EEPROM, and antifuse devices.

Furthermore, one of ordinary skill in the art will understand, upon reading and comprehending this disclosure, how to incorporate NV memory cells according to the present invention into a larger electronic system. Such an electronic system includes a processor or arithmetic/logic unit (ALU), a control unit, a memory device unit and an input/output (I/O) device. Generally, such an electronic system will have a native set of instructions that specify operations to be performed on data by the processor and other interactions between the processor, the memory device unit and the I/O devices. The memory device unit contains the data plus a stored list of instructions. The control unit coordinates all operations of the processor, the memory device and the I/O devices by continuously cycling through a set of operations that cause instructions to be fetched from the memory device and executed. Additionally, one of ordinary skill in the art will understand, upon reading and comprehending this disclosure, how to incorporate NV memory device and arrays according to the present invention with a random-logic device or programmable logic array (PLA) to program or alter logical functions or logical states of such programmable logic device (PLD) and/or alterable logic device (ALD). The NV memory device and arrays are coupled to input/output nodes of the rand-logic device or PLA as appropriate for the desired function The figures presented and described in detail above are similarly useful in describing the method aspects of the present subject matter. One of ordinary skill in the art will understand these methods upon reading and understanding this disclosure.

The present subject matter provides a gate stack for a nonvolatile multi-threshold FET device that promotes low power, low programming voltage for write and erase cycles, and improved endurance. A higher capacitive coupling efficiency is achieved by replacing floating gate technology with floating plate (charge center) technology, and using a high K dielectric. Furthermore, an injector medium enhances the tunneling effect. The gate stack is capable of being used in applications which are compatible and scalable with power supply and lithography scaling. Additionally, the gate stack is capable of being used in devices and circuits that readily integrate with general fixed threshold memory and logic devices, circuits and functions. Due the lower programming voltage and electric field, which is considerably less than the breakdown of the dielectric, the gate stack promotes faster writing and erasing capabilities.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. Combinations of the above embodiments, and other embodiments will be apparent to those of skill in the art upon reviewing the above description. The scope of the invention includes any other applications in which the above structures and fabrication methods are used. The scope of the invention should be determined with reference to the appended claims, along with the full scope of equivalents to which such claims are entitled.

What is claimed is:

1. A gate stack, comprising:
a first injector medium;
a tunnel medium disposed on the first injector medium;
a high K charge blocking and charge storing medium disposed on the tunnel medium; and
a second injector medium disposed on the high K charge blocking and charge storing medium.

2. The gate stack of claim 1, wherein the first injector medium is disposed on a NO surface treated substrate.

3. The gate stack of claim 1, wherein the first injector medium is disposed on a $NH_3$ surface treated substrate.

4. The gate stack of claim 1, wherein the tunnel medium is selected from the group consisting of tunnel $Al_2O_3$ and tunnel $SiO_2$.

5. The gate stack of claim 1, wherein the injector medium is selected from the group consisting of injector silicon rich nitride (SRN), injector silicon rich oxide (SRO), and silicon rich aluminum nitride.

6. The gate stack of claim 1, wherein the high K charge blocking and charge storing medium includes $Al_2O_3$.

7. A gate stack, comprising:
a first injector medium;
a tunnel medium disposed on the first injector medium;
a high K charge blocking and charge storing medium disposed on the tunnel medium, wherein the high K charge blocking and charge storing medium includes nano crystals for providing charge trapping charge centers; and
a second injector medium disposed on the high K charge blocking and charge storing medium.

8. The gate stack of claim 7, wherein the nano crystals include silicon nano crystals.

9. The gate stack of claim 7, wherein the nano crystals include gold nano crystals.

10. The gate stack of claim 7, wherein the nano crystals include tungsten nano crystals.

11. The gate stack of claim 7, wherein the nano crystals include silicided nano crystals.

12. A gate stack, comprising:
a first injector medium, wherein the first injector medium includes injector silicon rich nitride (SRN);
a tunnel medium disposed on the first injector medium;
a high K charge blocking and charge storing medium disposed on the tunnel medium, wherein the high K charge blocking and charge storing medium includes nano crystals for providing charge trapping charge centers; and
a second injector medium disposed on the high K charge blocking and charge storing medium, wherein the second injector medium includes injector SRN.

13. The gate stack of claim 12, wherein the first injector medium is disposed on a NO surface treated substrate or on a $NH_3$ surface treated substrate.

14. The gate stack of claim 12, wherein the tunnel medium includes tunnel $Al_2O_3$.

15. The gate stack of claim 12, wherein the tunnel medium includes tunnel $SiO_2$.

16. The gate stack of claim 12, wherein the high K charge blocking and charge storing medium includes $Al_2O_3$.

17. The gate stack of claim 12, wherein the nano crystals include silicon nano crystals.

18. The gate stack of claim 12, wherein the nano crystals include gold nano crystals.

19. The gate stack of claim 12, wherein the nano crystals include tungsten nano crystals.

20. The gate stack of claim 12, wherein the nano crystals include silicided nano crystals.

* * * * *